(12) United States Patent
Okumura

(10) Patent No.: US 10,529,848 B2
(45) Date of Patent: Jan. 7, 2020

(54) INSULATED-GATE SEMICONDUCTOR DEVICE AND METHOD OF MANUFACTURING THE SAME

(71) Applicant: FUJI ELECTRIC CO., LTD., Kawasaki-shi (JP)

(72) Inventor: Keiji Okumura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/170,562

(22) Filed: Oct. 25, 2018

(65) Prior Publication Data

US 2019/0181261 A1 Jun. 13, 2019

(30) Foreign Application Priority Data

Dec. 13, 2017 (JP) ................. 2017-238885

(51) Int. Cl.
H01L 29/06 (2006.01)
H01L 29/78 (2006.01)
H01L 29/66 (2006.01)
H01L 29/10 (2006.01)
H01L 29/45 (2006.01)
H01L 29/739 (2006.01)
H01L 29/16 (2006.01)

(52) U.S. Cl.
CPC ...... H01L 29/7813 (2013.01); H01L 29/0615 (2013.01); H01L 29/0623 (2013.01); H01L 29/0696 (2013.01); H01L 29/1095 (2013.01); H01L 29/45 (2013.01); H01L 29/66348 (2013.01); H01L 29/66734 (2013.01); H01L 29/1608 (2013.01); H01L 29/7397 (2013.01)

(58) Field of Classification Search
CPC ............ H01L 29/7813; H01L 29/0615; H01L 29/0696; H01L 29/0623
See application file for complete search history.

(56) References Cited

U.S. PATENT DOCUMENTS

| 6,919,599 B2 | 7/2005 | Henson |
| 2004/0065920 A1 | 4/2004 | Henson |
| 2008/0185593 A1 | 8/2008 | Saggio et al. |

FOREIGN PATENT DOCUMENTS

| JP | 2001313393 A | 11/2001 |
| JP | 2005005655 A | 6/2005 |
| JP | 3943054 B2 | 4/2007 |
| JP | 2013211447 A | 10/2013 |

Primary Examiner — Douglas M Menz

(57) ABSTRACT

An insulated-gate semiconductor device includes: an n-type current spreading layer provided on an n⁻-type drift layer; a p⁺-type base region provided on the current spreading layer; an n⁺-type source region provided in an upper portion of the base region; an insulated-gate electrode structure provided inside a trench; a p⁺-type gate-bottom protection-region provided in the current spreading layer so as to be in contact with a bottom of the trench; and a p⁺-type base-bottom buried-region buried in the current spreading layer, having a bottom surface having the same depth as a bottom surface of the gate-bottom protection-region, wherein the base-bottom buried-region is divided into a plurality of portions in a depth direction through an n-type separation layer.

7 Claims, 22 Drawing Sheets

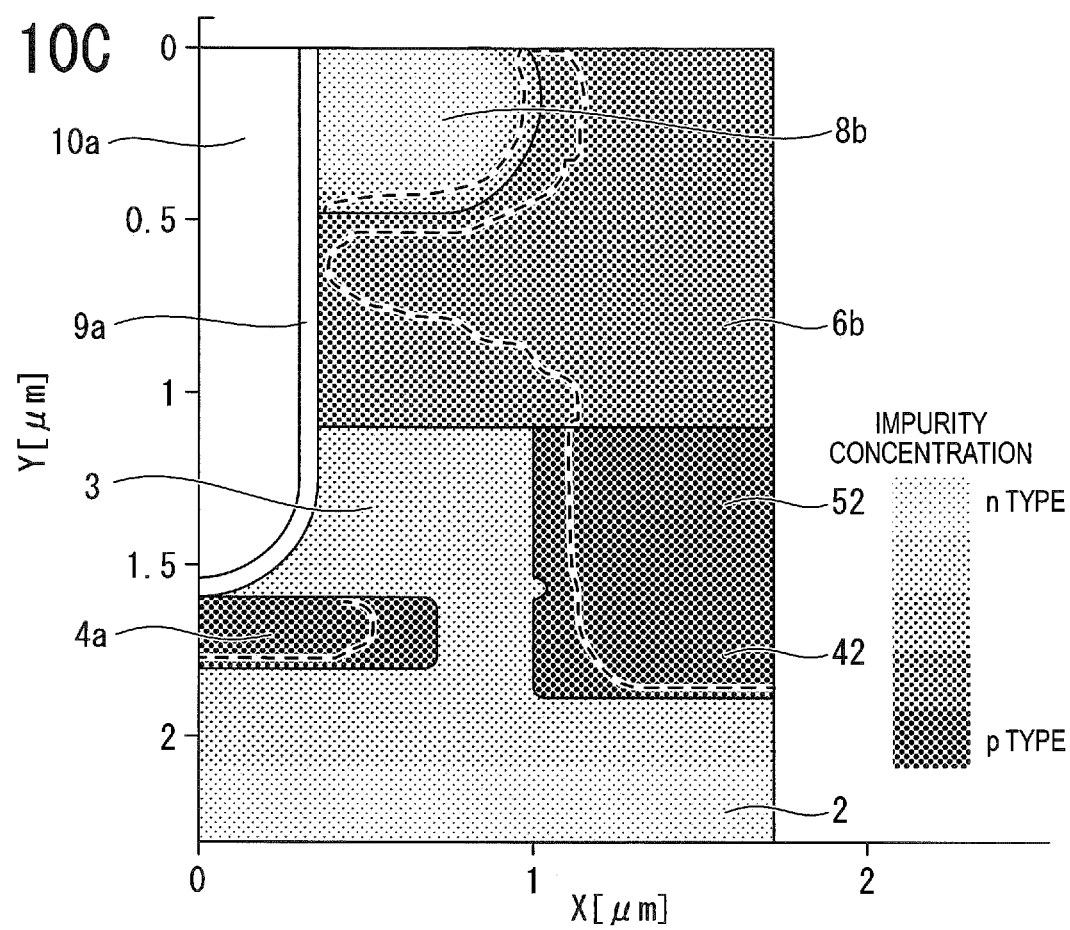

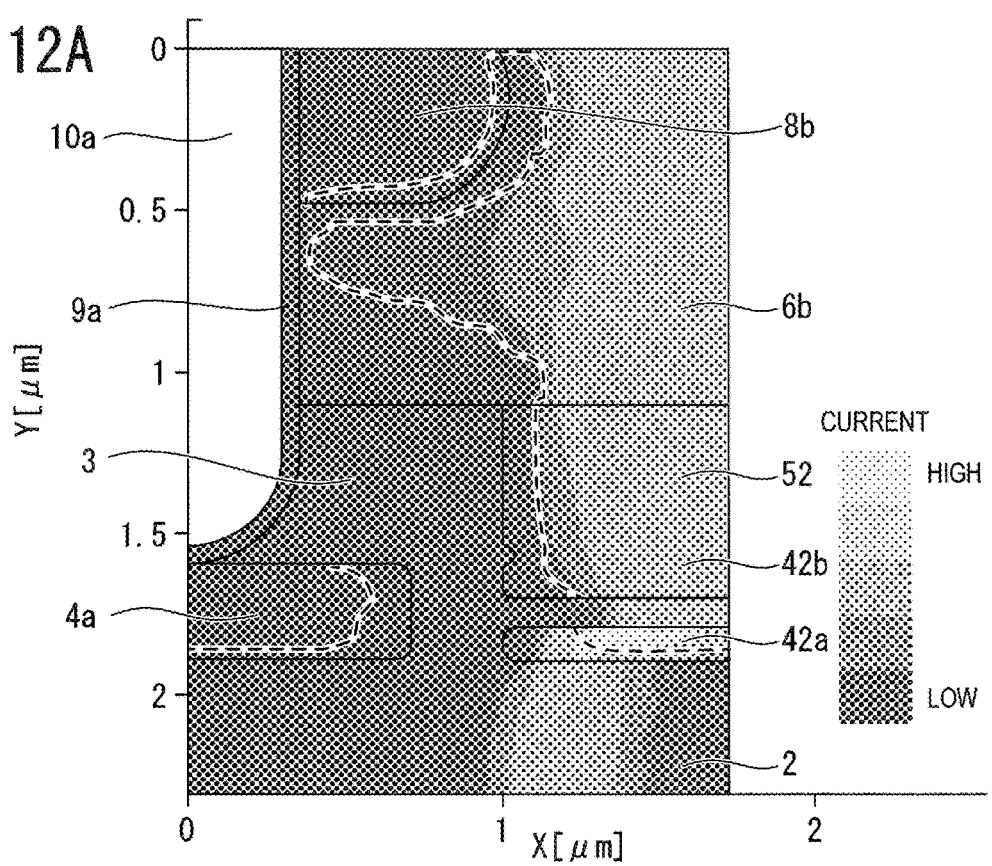
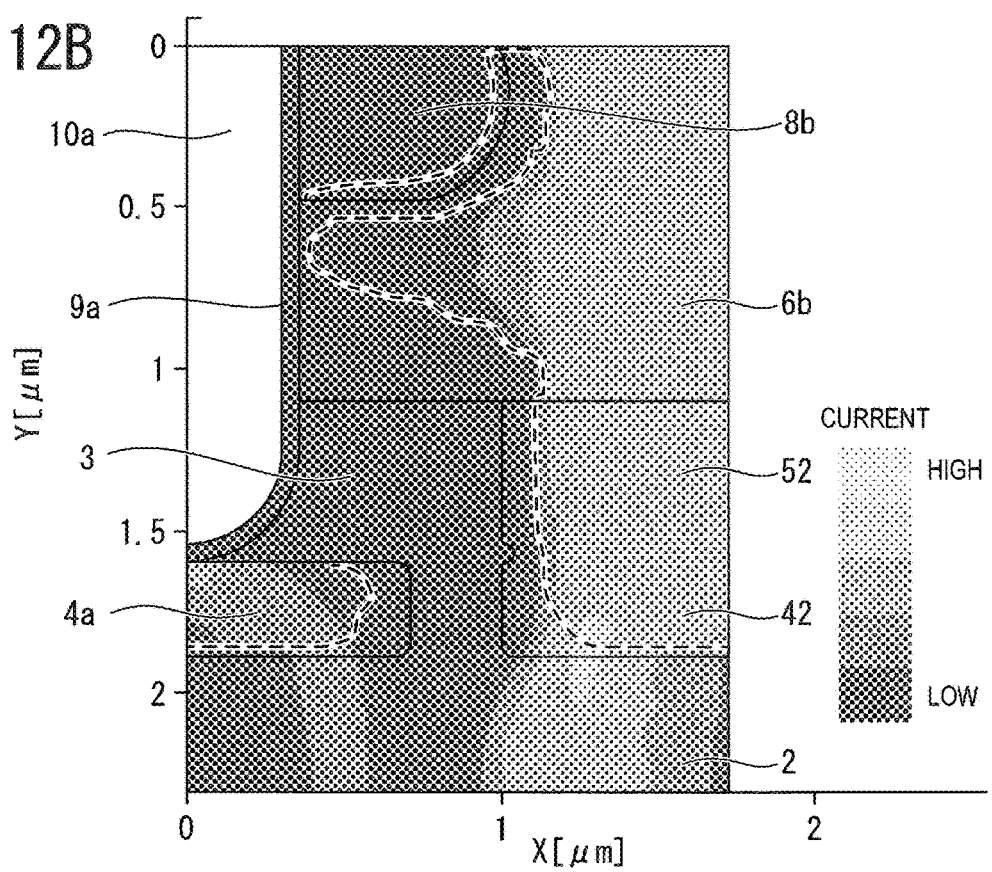

INSULATED-GATE SEMICONDUCTOR DEVICE AND METHOD OF MANUFACTURING THE SAME

CROSS-REFERENCE TO RELATED APPLICATION

This application claims benefit of priority under 35 USC 119 based on Japanese Patent Application No. 2017-238885 filed on Dec. 13, 2017, the entire contents of which are incorporated by reference herein.

TECHNICAL FIELD

The present invention relates to an insulated-gate semiconductor device, which has an insulated-gate electrode structure provided in a trench and a method of manufacturing the same.

BACKGROUND

In a trench gate MOS field effect transistor (MOSFET), reduction of on resistance due to reduction of cell pitch can be expected with respect to the planer gate MOSFET. In a trench gate MOSFET using a wide band gap semiconductor such as silicon carbide (SiC) as a material, a high voltage is easily applied to a gate insulating film located at the bottom of a trench, and thus, there is a concern that the gate insulating film may be broken.

A structure in which a $p^+$-type region is provided at the bottom of the trench and a $p^+$-type region is provided below a contact region between the trenches so as to relax the electric field intensity at the bottom of the trench has been proposed. In this case, when a reverse bias is applied, it is important to allow the avalanche current to relatively more easily flow in the $p^+$-type region below the contact region than the $p^+$-type region at the bottom of the trench.

Therefore, it is considered that an $n^+$-type region is selectively formed under the $p^+$-type region below the contact region to concentrate the electric field on the $p^+$-type region below the contact region so as to allow the avalanche current to relatively easily flow. However, since the electric field concentrates locally on the $p^+$-type region below the contact region, there is a problem that the breakdown voltage of an active area is decreased and the breakdown voltage margins of the peripheral area and the active area are decreased.

In addition, JP 3943054 B2 discloses a structure in which a p-type electric field relaxation region below a p-type contact region is arranged to be separated from a channel region in a trench gate MOSFET. JP 2001-313393 A discloses a structure in which a plurality of p-type buried regions are arranged below a p-type base layer in a power MOSFET. US 2008/0,185,593 A discloses a structure in which a plurality of p-type implantation regions are provided below a source region in a SiC planar MOSFET. JP 2013-21447 A discloses a structure in which a plurality of p-type semiconductor layers are provided below a contact region in a SiC planar MOSFET.

SUMMARY

In view of the above problems, an object of the present invention is to provide an insulated-gate semiconductor device capable of preventing an avalanche current from flowing at the bottom of a trench while maintaining a breakdown voltage of an active area and capable of protecting a gate insulating film at the bottom of the trench and a method of manufacturing the same.

An aspect of the present invention inheres in an insulated-gate semiconductor device encompassing: a drift layer having a first conductivity type, made of a semiconductor material having a band gap wider than that of silicon; a current spreading layer having the first conductivity type, provided on the drift layer and having an impurity concentration higher than that of the drift layer; a base region having a second conductivity type, provided on the current spreading layer; a main electrode region having the first conductivity type, provided in an upper portion of the base region and having an impurity concentration higher than that of the drift layer; an insulated gate-electrode structure provided in a trench penetrating the main electrode region and the base region; a gate-bottom protection-region having the second conductivity type, selectively provided in an inner portion of the current spreading layer so as to be in contact with a bottom of the trench and having an impurity concentration higher than that of the base region; a base-bottom buried-region having the second conductivity type, buried in an inner portion of the current spreading layer, being separated from the trench, having a bottom surface at the same depth as a bottom surface of the gate-bottom protection-region, and having an impurity concentration higher than that of the base region; and a separation layer having the first conductive type, configured to divide the base-bottom buried-region into a plurality of portions in a depth direction.

Another aspect of the present invention inheres in a method of an insulated-gate semiconductor device encompassing: forming a current spreading layer of a first conductivity type on a drift layer of the first conductivity type, the current spreading layer having an impurity concentration higher than that of the drift layer, the drift layer is made of a semiconductor material having a band gap wider than that of silicon; selectively burying a gate-bottom protection-region of a second conductivity type in an inner portion of the current spreading layer; burying a base-bottom buried-region of the second conductivity type in another inner portion of the current spreading layer, the base-bottom buried-region has a bottom surface at the same depth as a bottom surface of the gate-bottom protection-region, and the base-bottom buried-region is divided into a plurality of portions in a depth direction through a separation layer of the first conductivity type; forming a base region of the second conductivity type on the current spreading layer; forming a main electrode region of the first conductivity type in an upper portion of the base region, the main electrode region having an impurity concentration higher than that of the drift layer; forming a trench penetrating the base region and reaching the gate-bottom protection-region; and forming an insulated gate-electrode structure inside the trench.

BRIEF DESCRIPTION OF THE DRAWINGS

FIG. 10C is a graph illustrating a simulated result of impurity concentration of an insulated-gate semiconductor device according to a second comparative example;

FIG. 12A is a graph illustrating a simulated result of current when a reverse bias is applied to the insulated-gate semiconductor device according to the embodiment of the present invention;

FIG. 12B is a graph illustrating a simulated result of current when a reverse bias is applied to the insulated-gate semiconductor device according to the first comparative example;

DETAILED DESCRIPTION

Figure 1:
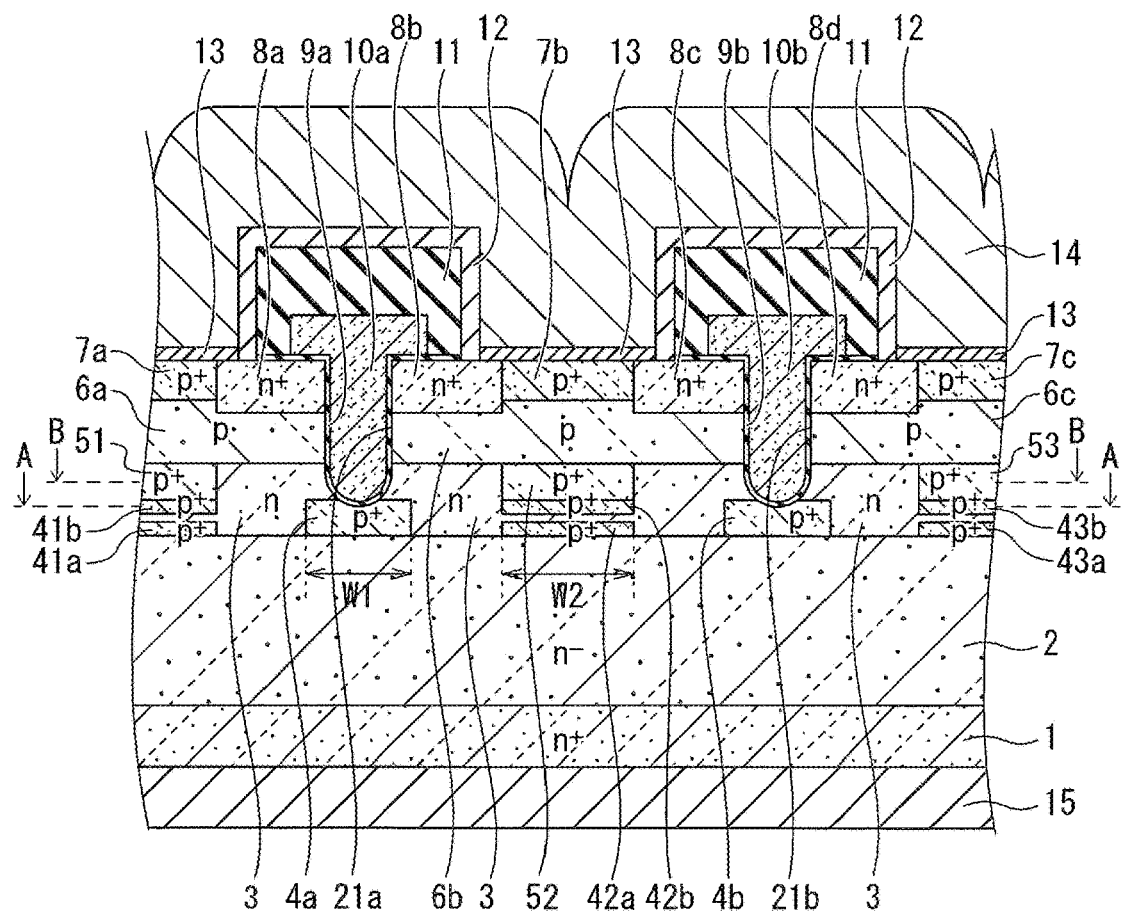
FIG. 1 is a cross-sectional view of main components illustrating an example of an insulated-gate semiconductor device according to an embodiment of the present invention.

With reference to the Drawings, an embodiment of the present invention will be described below. In the Specification and the Drawings, the same or similar elements are indicated by the same or similar reference numerals. The drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions. The embodiment described below merely illustrate schematically semiconductor devices for specifying and giving shapes to the technical idea of the present invention, and the span of the technical idea is not limited to materials, shapes, structures, and relative positions of elements described herein.

In the Specification, a "first main-electrode region" is assigned to a semiconductor region which will be a source region or a drain region in a field-effect transistor (FET) or a static induction transistor (SIT), an emitter region or a collector region in an insulated-gate bipolar transistor (IGBT) and an anode region or a cathode region in a static induction (SI) thyristor or a gate turn-off (GTO) thyristor. A "second main-electrode region" is assigned to a semiconductor region which will not be the first main-electrode region and will be the source region or the drain region in the FET or the SIT, the emitter region or the collector region in the IGBT, and the anode region or the cathode region in the SI thyristor or the GTO thyristor. That is, when the first main-electrode region is the source region, the second main-electrode region means the drain region. When the first main-electrode region is the emitter region, the second main-electrode region means the collector region. When the first main-electrode region is the anode region, the second main-electrode region means the cathode region. In some appropriate cases such as MOSFET, a function of the first main-electrode region and a function of the second main-electrode region are exchangeable each other by exchanging a bias relationship if the structure of the subject semiconductor device is symmetric. Furthermore, a "main-electrode region" is described in the Specification, the main-electrode region comprehensively means any one of the first main-electrode region and the second main-electrode region.

In the following description, the definitions of directions such as "top" and "bottom" are defined depending on cross-sectional views. For example, when the direction of a semiconductor device is changed by 90 degrees and is then observed, the terms "top" and "bottom" change to "left" and "right", respectively. When the observing direction of the semiconductor integrated circuit is changed by 180 degrees, the terms "top" and "bottom" shall be reversed. In the following description, an example in which a first conductivity type is an n-type and a second conductivity type is a p-type opposite to the first conductivity type will be described. However, the relationship between the conductivity types may be reversed such that the first conductivity type is a p-type and the second conductivity type is an n-type. In the Specification and the accompanying Drawings, semiconductor regions, being labeled with symbols "+" as superscript to "p" or "n", represent heavily doped semiconductor regions, of which the impurity concentration is higher than that of a semiconductor region without the superscript "+". And, the semiconductor regions, being labeled with symbols "−" as superscripts to "p" or "n", represent lightly doped semiconductor regions, of which the impurity concentration is lower than that of a semiconductor region without the superscript "−". Note that the heavily doped semiconductor regions or the lightly doped semiconductor regions, being labeled with superscript "+" or "−", do not mean the semiconductor regions which have strictly the same impurity concentrations.

As illustrated in FIG. 1, an insulated-gate semiconductor device (MISFET) according to an embodiment of the present invention includes a drift layer 2 and a current spreading layer (CSL) 3, both having a first conductivity type ($n^-$-type). The spreading layer 3 has an impurity concentration higher than that of the drift layer 2 and being arranged on the upper surface of the drift layer 2. Each of the drift layer 2 and the current spreading layer 3 is implemented by an SiC epitaxial growth layer. The impurity concentration of the current spreading layer 3 is, for example, about $1\times10^{17}$ $cm^{-3}$.

Base regions 6a to 6c having a second conductivity type (p-type) are arranged on the upper surface of the current spreading layer 3. The base regions 6a to 6c may also be implemented by SiC epitaxial growth layers. The impurity concentration of the base regions 6a to 6c is, for example, about $2\times10^{16}$ $cm^{-3}$ to $2\times10^{18}$ $cm^{-3}$. $n^+$-type first main electrode regions (source regions) 8a to 8d having an impurity concentration higher than that of the drift layer 2 are selectively provided in upper portions of the base regions 6a to 6c.

$p^+$-type base-contact regions 7a to 7c having an impurity concentration higher than those of the base regions 6a to 6c are selectively provided in upper portions of the base regions 6a to 6c. The base-contact region 7a is in contact with the source region 8a. The base-contact region 7b is in contact with the source regions 8b and 8c. The base-contact region 7c is in contact with the source region 8d.

From the upper surfaces of the source regions 8a to 8d, trenches 21a and 21b extend to the current spreading layer 3, penetrating the source regions 8a to 8d and the base regions 6a to 6c. For example, the depth of the trenches 21a and 21b is about one micrometer to two micrometer; the width is about 0.5 micrometer to one micrometer, and the interval is about one micrometer to two micrometer. Gate insulating films 9a and 9b are provided on the bottom surfaces and the side surfaces of the trenches 21a and 21b. As the gate insulating films 9a and 9b, in addition to a silicon oxide film ($SiO_2$ film), there may be adopted a single layer film of any one of a silicon oxynitride (SiON) film, a strontium oxide (SrO) film, a silicon nitride ($Si_3N_4$) film, an aluminum oxide ($Al_2O_3$) film, a magnesium oxide (MgO) film, an yttrium oxide ($Y_2O_3$) film, a hafnium oxide ($HfO_2$) film, a zirconium oxide ($ZrO_2$) film, a tantalum oxide ($Ta_2O_5$) film, and a bismuth oxide ($Bi_2O_3$) film or a composite film obtained by laminating a plurality of these films.

Gate electrodes 10a and 10b are buried inside the trenches 21a and 21b with gate insulating films 9a and 9b interposed, so that an insulated-gate electrode structure (9a, 9b, 10a, 10b) is implemented. As the material of the gate electrodes 10a and 10b, for example, a polysilicon layer (doped polysilicon layer) which is heavily doped with impurities such as phosphorus (P) may be used. In addition, FIG. 1 illustrates a case where the gate electrodes 10a and 10b extend to the upper surfaces of the source regions 8a to 8d through the gate insulating films 9a and 9b, but the gate electrodes 10a and 10b may be buried only inside the trenches 21a and 21b.

$p^+$-type gate-bottom protection-regions 4a and 4b are buried under the current spreading layer 3 so that the upper surfaces are separated from the base regions 6a to 6c and are in contact with the bottoms of the trenches 21a and 21b. The impurity concentration of the gate-bottom protection-regions 4a and 4b is, for example, about $5\times10^{17}$ $cm^{-3}$ to $2\times10^{19}$ $cm^{-3}$. The gate-bottom protection-regions 4a and 4b protect the gate insulating films 9a and 9b located at the bottoms of the trenches 21a and 21b from a high voltage during a reverse bias.

In addition, in FIG. 1, a case where the bottoms of the trenches 21a and 21b penetrate the current spreading layer 3 to be in contact with the gate-bottom protection-regions 4a and 4b is exemplified, but this case is merely an example. The bottoms of the trenches 21a and 21b are not necessarily in contact with the gate-bottom protection-regions 4a and 4b. For example, relatively shallow concave portions may be formed in the current spreading layer 3 so that the current spreading layer 3 remains on the gate-bottom protection-regions 4a and 4b, and the bottoms of the trenches 21a and 21b are in contact with the bottoms of the concave portions.

In the inner portion of the current spreading layer 3, p+-type base-bottom buried-regions (41a, 41b, 51; 42a, 42b, 52; 43a, 43b, 53) are provided at positions below the base-contact regions 7a to 7c to be separated from the gate-bottom protection-regions 4a and 4b. The bottom surfaces of the base-bottom buried-regions (41a, 41b, 51; 42a, 42b, 52; 43a, 43b, 53) are located at the same depth as the bottom surfaces of the gate-bottom protection-regions 4a and 4b. For example, the width W2 of the base-bottom buried-regions (41a, 41b, 51; 42a, 42b, 52; 43a, 43b, 53) defined on the cross-sectional view of FIG. 1 may be equal to the width W1 of the gate-bottom protection-regions 4a and 4b. Alternatively, the width W2 may be larger than the width W1, and the width W2 may be smaller than the width W1.

The base-bottom buried-regions (41a, 41b, 51; 42a, 42b, 52; 43a, 43b, 53) are divided into a plurality of buried regions in the depth direction, and these buried regions are separated through n-type semiconductor layers, or separation layers, in such a manner of interposing a portion of the current spreading layer 3. The base-bottom buried-region (41a, 41b, 51) has a plurality of lower-buried regions 41a and 41b and an upper-buried region 51 arranged on the lower-buried regions 41a and 41b. The base-bottom buried-region (42a, 42b, 52) has a plurality of lower-buried regions 42a and 42b and an upper-buried region 52 arranged on the lower-buried regions 42a and 42b. The base-bottom buried-region (43a, 43b, 53) has a plurality of lower-buried regions 43a and 43b and an upper-buried region 53 arranged on the lower-buried regions 43a and 43b.

The lower-buried regions 41a and 41b, the lower-buried regions 42a and 42b, and the lower-buried regions 43a and 43b belong to the same depth level as the gate-bottom protection-regions 4a and 4b. The bottom surfaces of the lower-buried regions 41a, 42a, and 43a of the lower layer have the same depth as the bottom surfaces of the gate-bottom protection-regions 4a and 4b. The upper surfaces of the lower-buried regions 41b, 42b, and 43b of the upper layer have the same depth as the upper surfaces of the gate-bottom protection-regions 4a and 4b. Each of the lower-buried regions 41a and 41b, the lower-buried regions 42a and 42b, and the lower-buried regions 43a and 43b is divided into a plurality of buried regions in the depth direction, and equivalently, these buried regions are separated through n-type semiconductor layers, or separation layers, in such a manner of interposing a portion of the current spreading layer 3. From a different point of view, the above-described structure can be considered to a structure in which the current spreading layer 3 is connected through gaps between the lower-buried regions 41a and 41b, the lower-buried regions 42a and 42b, and the lower-buried regions 43a and 43b. The bottom surfaces of the upper-buried regions 51, 52, and 53 are in contact with the upper surfaces of the lower-buried regions 41b, 42b, and 43b, respectively. The upper surfaces of the upper-buried regions 51, 52 and 53 are in contact with the bottom surfaces of the base regions 6a to 6c, respectively.

The impurity concentrations of the lower-buried regions 41a and 41b, the lower-buried regions 42a and 42b, and the lower-buried regions 43a and 43b are equal to the impurity concentrations of the gate-bottom protection-regions 4a and 4b. The impurity concentrations of the upper-buried regions 51, 52, and 53 may be, for example, equal to the impurity concentrations of the lower-buried regions 41a and 41b, the lower-buried regions 42a and 42b, and the lower-buried regions 43a and 43b or may be lower than the impurity concentrations of the lower-buried regions 41a and 41b, the lower-buried regions 42a and 42b, and the lower-buried regions 43a and 43b. For example, the impurity concentrations of the lower-buried regions 41a and 41b, the lower-buried regions 42a and 42b, the lower-buried regions 43a and 43b may be about $5 \times 10^{17}$ cm$^{-3}$ to $2 \times 10^{19}$ cm$^{-3}$, and the impurity concentrations of the upper-buried region 51, 52 and 53 may be about $3 \times 10^{17}$ cm$^{-3}$ to $1 \times 10^{19}$ cm$^{-3}$.

Figure 2:
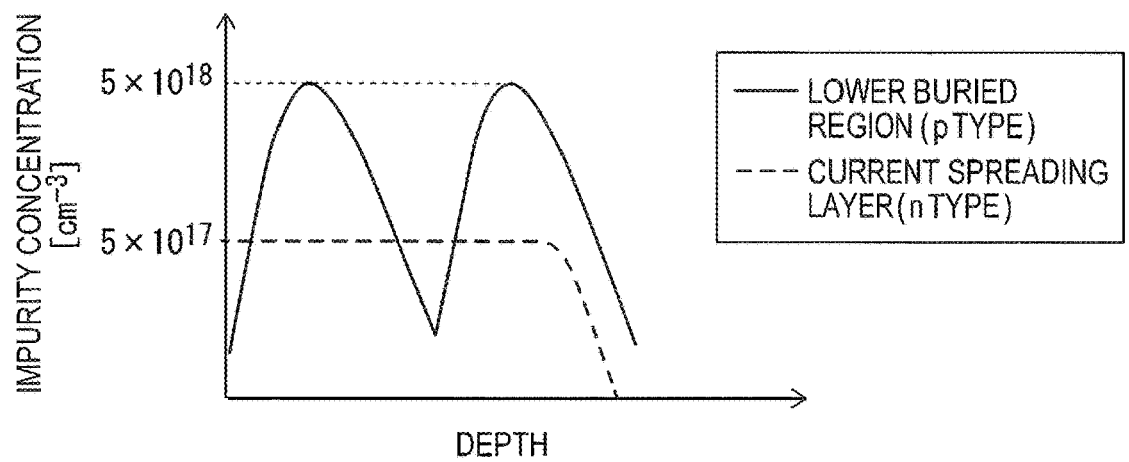
FIG. 2 is a graph illustrating an impurity concentration profile of a portion of a lower-buried region of the insulated-gate semiconductor device according to the embodiment of the present invention in a depth direction.

FIG. 2 illustrates an impurity concentration profile of a portion of the lower-buried regions 41a and 41b illustrated in FIG. 1 obtained by cutting in the depth direction. In FIG. 2, the profile of the n-type impurities corresponding to the current spreading layer 3 is exemplarily set to a value of about $1 \times 10^{17}$ cm$^{-3}$ in the depth direction. The profile of the p-type impurities corresponding to the lower-buried regions 41a and 41b has two Gaussian distribution peaks of about $5 \times 10^{18}$ cm$^{-3}$. At the position of the current spreading layer 3 between the lower-buried regions 41a and 41b, the impurity concentration of the p-type impurities becomes lower than the impurity concentration of the n-type impurities. That is, a p-n-p structure is formed the lower-buried regions 41a and 41b of which impurity concentration profile has two peaks eventually have a profile where the current spreading layer 3 is interposed between the two peaks.

Figure 3:
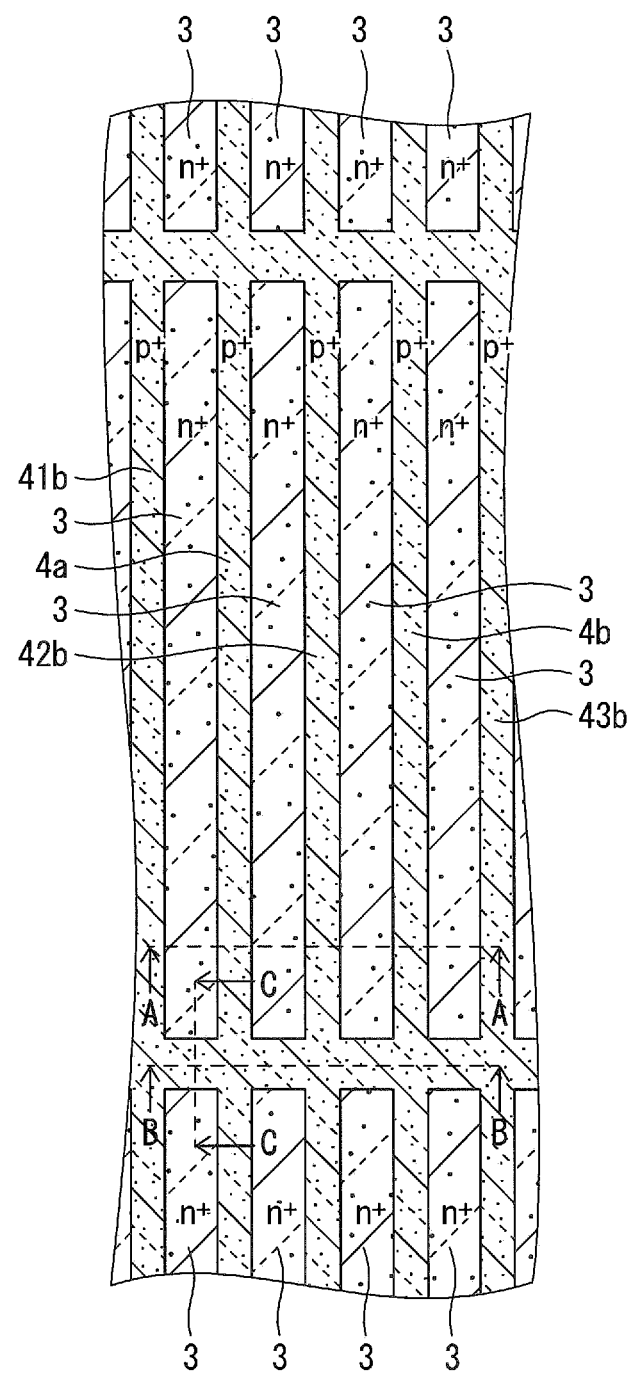
FIG. 3 is a horizontal cross-sectional view of the insulated-gate semiconductor device taken from an A-A direction in FIG. 1.
Figure 4:
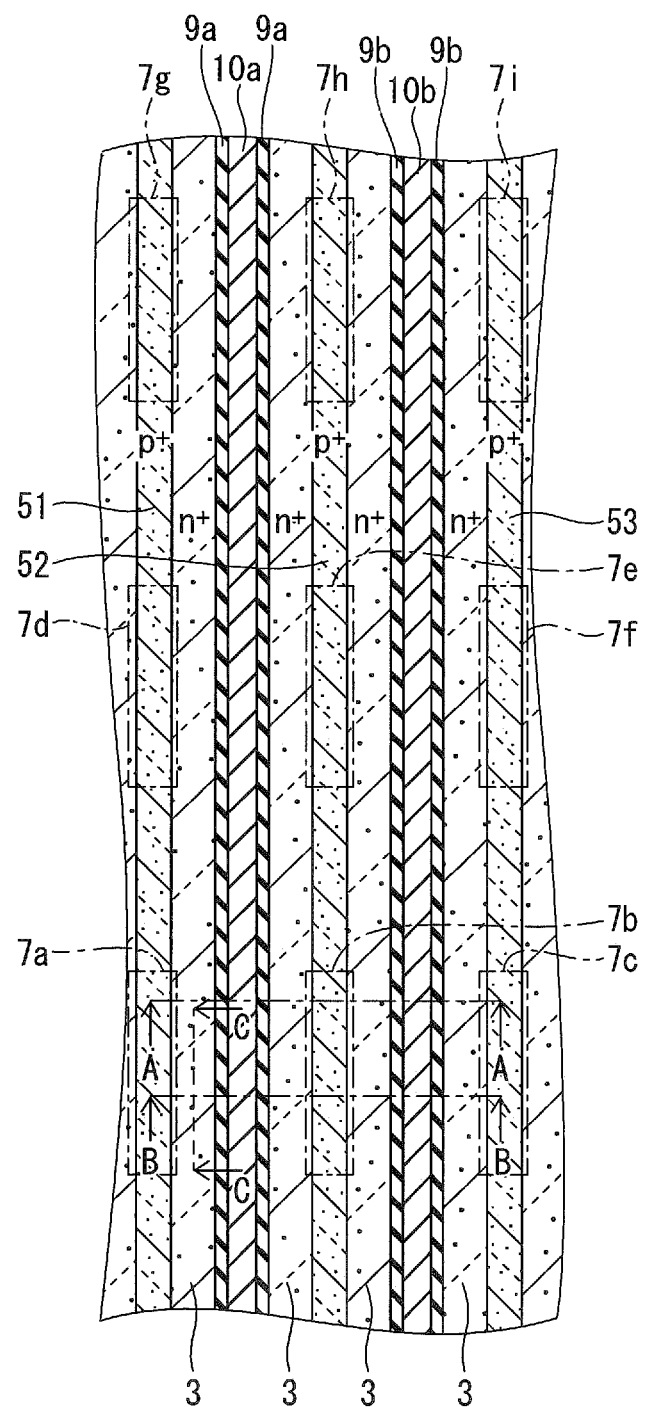
FIG. 4 is a horizontal cross-sectional view of the insulated-gate semiconductor device taken from a B-B direction in FIG. 1.

FIG. 3 illustrates a plan view taken from the A-A direction in which the lower-buried regions 41b, 42b, and 43b in FIG. 1 are horizontally cut, and FIG. 4 illustrates a plan view taken from the B-B direction in which the upper-buried regions 51, 52, and 53 in FIG. 1 are horizontally cut. The cross-sectional views taken from the A-A direction in FIGS. 3 and 4 correspond to FIG. 1. As illustrated in FIG. 3, the planar patterns of the lower-buried regions 41b, 42b, and 43b and the gate-bottom protection-regions 4a and 4b are formed in a stripe shape and extend parallel to each other. The lower-buried regions 41b, 42b, 43b and the gate-bottom protection-regions 4a and 4b are connected at predetermined intervals in the longitudinal direction of the planar pattern of the lower-buried regions 41b, 42b, and 43b and the gate-bottom protection-regions 4a and 4b in the parallel direction perpendicular to the longitudinal direction.

As illustrated in FIG. 4, the planar patterns of the upper-buried regions 51, 52, and 53 and the gate electrodes 10a and 10b are formed in a stripe shape and extend parallel to each other. In FIG. 4, positions of the base-contact regions 7a to 7i are schematically indicated by one-dot chain lines so as to represent imaginary lines. The base-contact regions 7a, 7d, and 7g are arranged above the upper-buried region 51 at predetermined intervals. The base-contact regions 7b, 7e, and 7h are arranged above the upper-buried region 52 at the same periods as those of the base-contact regions 7a, 7d, and 7g. The base-contact regions 7c, 7f, and 7i are arranged above the upper-buried region 53 at the same periods as those of the base-contact regions 7a, 7d, and 7g and the base-contact regions 7a, 7d, and 7g.

Figure 5:
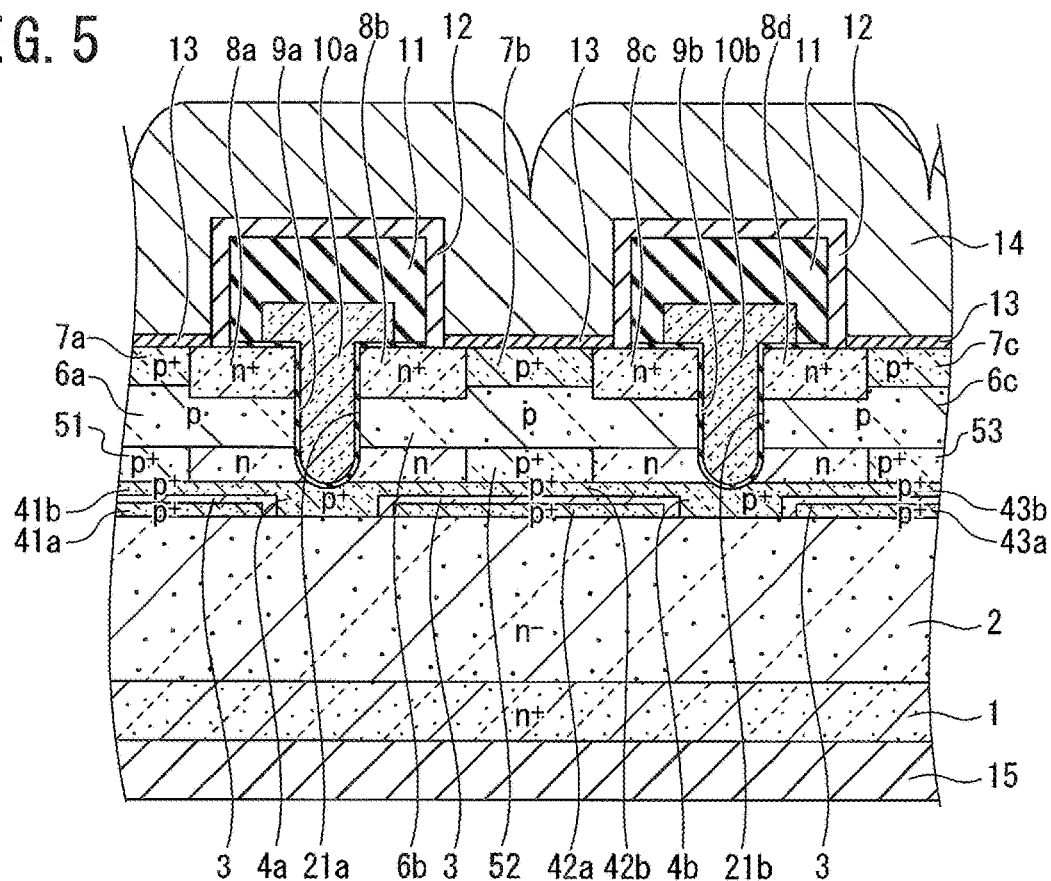
FIG. 5 is a vertical cross-sectional view of the insulated-gate semiconductor device taken from the B-B direction in FIG. 3.
Figure 6:
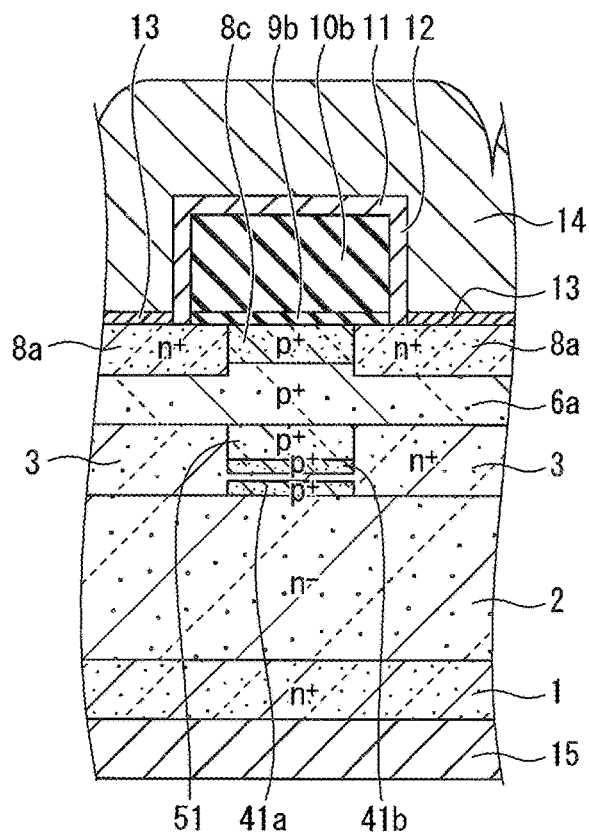
FIG. 6 is a vertical cross-sectional view of the insulated-gate semiconductor device taken from a C-C direction in FIG. 3.

The cross-sectional views taken from the B-B direction in FIGS. 3 and 4 correspond to FIG. 5. As illustrated in FIG. 5, the lower-buried regions 41b, 42b, and 43b of the upper layer and the gate-bottom protection-regions 4a and 4b are connected. The lower-buried regions 41a, 42a, and 43a of the lower layer and the gate-bottom protection-regions 4a and 4b are not connected, and the lower-buried regions 41a, 42a, and 43a are potentially floating. The cross-sectional views taken from the C-C direction in FIGS. 3 and 4 correspond to FIG. 6. As illustrated in FIG. 6, the current spreading layer 3 is connected through the gap between the peaks of the lower-buried regions 41a and 41b having the peaks of the two impurity profiles. Since a current flows through the gap between these two impurity profiles, JFET resistance can be reduced.

As illustrated in FIG. 1, a first main electrode (source electrode) 14 is arranged on the gate electrodes 10a and 10b with an interlayer insulating film 11 interposed. As the interlayer insulating film 11, there may be adopted a non-doped silicon oxide film ($SiO_2$ film) not containing phosphorus (P) or boron (B), which is called "NSG". However, as the interlayer insulating film 11, there may be adopted a phosphosilicate glass (PSG) film, a borosilicate glass (BSG) film, a borophosphosilicate glass (BPSG) film, a silicon nitride ($Si_3N_4$) film or the like. The source electrode 14 is electrically connected to the source regions 8a to 8d and the base-contact regions 7a to 7c. The source electrode 14 is arranged separately from the gate surface electrode (not illustrated) located at the back of the paper surface. As the gate surface electrode, the same material as the source electrode 14 may be used.

A source contact layer 13 and a barrier metallic layer 12 serving as underlying metal are arranged under the source electrode 14. The source contact layer 13 is arranged so as to be metallurgically contacted with the end portions of the source regions 8a to 8d and the base-contact regions 7a to 7c, respectively. The barrier metallic layer 12 is metallurgically contacted with the source regions 8a to 8d and extends from the source regions 8a to 8d so as to cover the side surface and the upper surface of the interlayer insulating film 11. The source electrode 14 is arranged so as to cover the source contact layer 13 and the barrier metallic layer 12. For example, the source contact layer 13 is implemented by a nickel silicide ($NiSi_x$) film, the barrier metallic layer 12 is implemented by a titanium nitride (TiN) film, and the source electrode 14 is implemented by an aluminum (Al) film.

On the bottom surface of the drift layer 2, an $n^+$-type second main electrode region (drain region) 1 is arranged so as to be in contact with the drift layer 2. The drain region 1 is implemented by a semiconductor substrate (SiC substrate) made of SiC. A second main electrode (drain electrode) 15 is arranged on the bottom surface of the drain region 1. As the drain electrode 15, there may be used, for example, a single layer film made of gold (Au) or a metal film laminated in the order of Al, nickel (Ni), and Au, and a metal film such as molybdenum (Mo) or tungsten (W) or an alloy layer obtained by depositing nickel (Ni) and titanium (Ti) and reacting with SiC may be further laminated at the lowermost layer of the single layer film or the metal film.

In FIG. 1, two unit cell structures including trenches 21a and 21b are illustrated as a portion of a cross section of main components. Actually, in the insulated-gate semiconductor device according to the embodiment of the present invention, a power semiconductor device (power device) for flowing a large current by periodically arranging a plurality of unit cell structures to form a multi-channel structure can be implemented.

At the time of operation of the insulated-gate semiconductor device according to the embodiment of the present invention, a positive voltage is applied to the drain electrode 15, and a positive voltage equal to or higher than a threshold value is applied to the gate electrodes 10a and 10b. As a result, inversion layers (channels) are formed on the sides of the base regions 6a to 6c closer to the gate electrodes 10a and 10b, so that the transistor is turned on. In the turned-on state, a current flows from the drain electrode 15 to the source electrode 14 through the drain region 1, the drift layer 2, the current spreading layer 3, the inversion layers of the base regions 6a to 6c, and the source regions 8a to 8d. On the other hand, in a case where the voltage applied to the gate electrodes 10a and 10b is lower than the threshold value, since no inversion layer is formed in the base regions 6a to 6c, the transistor is turned off, and thus, no current flows from the drain electrode 15 to the source electrode 14.

According to the insulated-gate semiconductor device according to the embodiment of the present invention, the base-bottom buried-regions (41a, 41b, 51; 42a, 42b, 52; 43a, 43b, 53) are separated in the depth direction with a portion of the current spreading layer 3 interposed. Then, since the lower-buried regions 41a, 42a, and 43a are potentially floating, an avalanche current more easily flows relatively in the lower-buried regions 41a, 42a, and 43a than the gate-bottom protection-regions 4a and 4b. Therefore, for example, even in a case where the width W2 of the base-bottom buried-regions (41a, 41b, 51; 42a, 42b, 52; 43a, 43b, 53) is larger than the width W1 of the gate-bottom protection-regions 4a and 4b, an avalanche current can be allowed to flow in the lower-buried regions 41a, 42a, and 43a.

In addition, the bottom surfaces of the base-bottom buried-regions (41a, 41b, 51; 42a, 42b, 52; 43a, 43b, 53) are equal in depth to the bottom surfaces of the gate-bottom protection-regions 4a and 4b. For this reason, the electric field is equally applied to the base-bottom buried-regions (41a, 41b, 51; 42a, 42b, 52; 43a, 43b, 53) and the gate-bottom protection-regions 4a and 4b, so that it is possible to prevent a high electric field from being locally applied to the base-bottom buried-regions (41a, 41b, 51; 42a, 42b, 52; 43a, 43b, 53). Therefore, it is possible to prevent the breakdown voltage of the active area from lowering, and it is possible to maintain the breakdown voltage margin between the peripheral area and the active area. In this manner, the gate insulating films 9a and 9b at the bottoms of the trenches 21a and 21b can be protected while maintaining the breakdown voltage of the active area.

Figure 7:
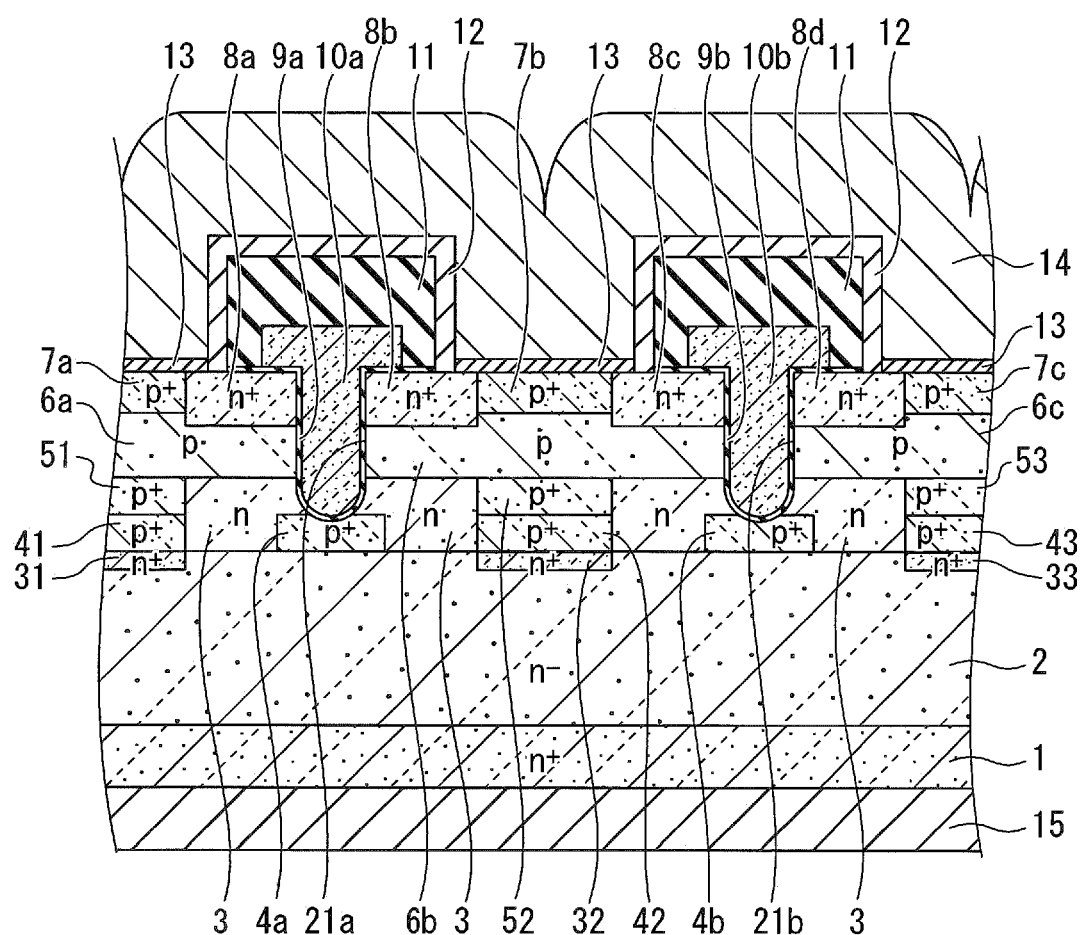
FIG. 7 is a cross-sectional view of main components of an insulated-gate semiconductor device according to a comparative example corresponding to a structure taken from the A-A direction in FIG. 3.
Figure 8:
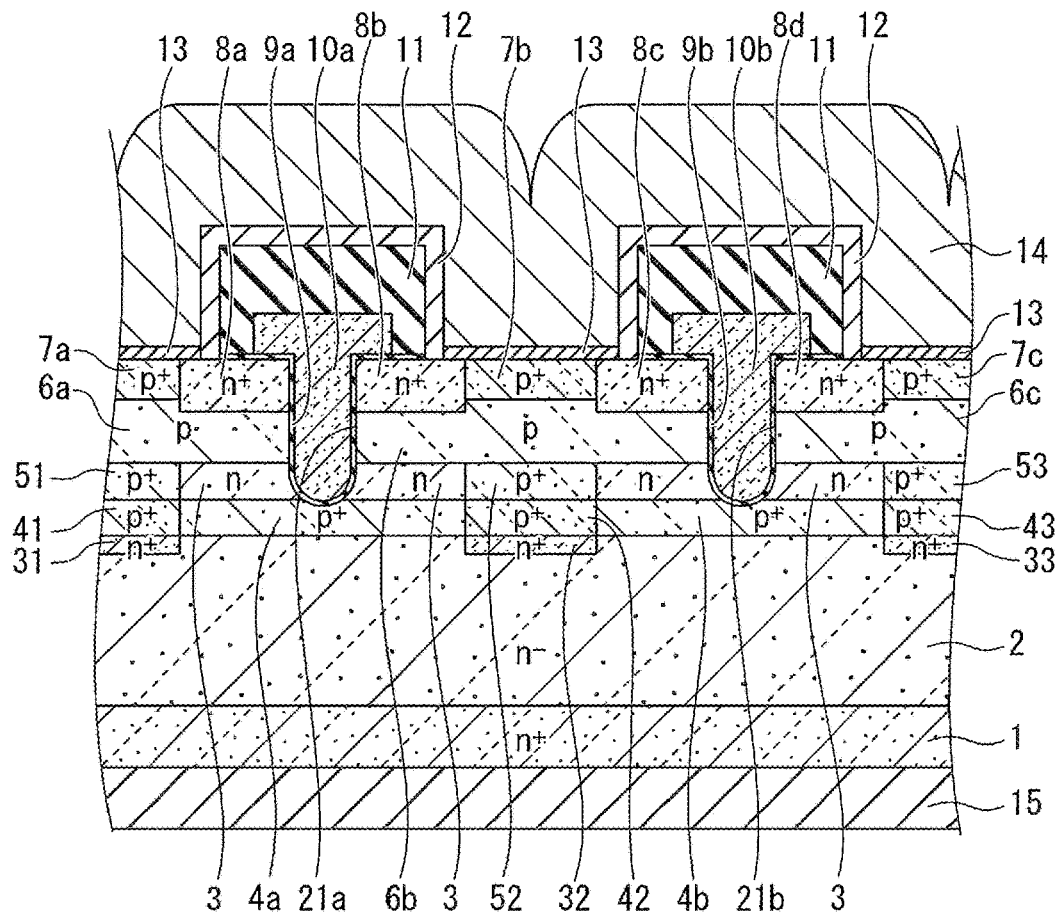
FIG. 8 is a cross-sectional view of main components illustrating an example of the insulated-gate semiconductor device according to the comparative example corresponding to the structure taken from the B-B direction in FIG. 3.

Herein, insulated-gate semiconductor devices according to comparative examples will be described. As illustrated in FIGS. 7 and 8, the insulated-gate semiconductor devices according to the comparative examples is different from the insulated-gate semiconductor device according to the embodiment of the present invention in that the base-bottom buried-regions (41, 51; 42, 52; 43, 53) are provided to be continuous in the depth direction. FIG. 7 corresponds to a cross-sectional view taken from the A-A direction in FIG. 3, and FIG. 8 corresponds to a cross-sectional view taken from the B-B direction in FIG. 3.

As illustrated in FIGS. 7 and 8, the base-bottom buried-region (41, 51) includes a lower-buried region 41 and an upper-buried region 51 provided on the upper surface of the lower-buried region 41 so as to be in contact with the lower-buried region 41. The base-bottom buried-region (42, 52) includes a lower-buried region 42 and an upper-buried region 52 provided on the upper surface of the lower-buried region 42 so as to be in contact with the lower-buried region 42. The base-bottom buried-region (43, 53) includes a lower-buried region 43 and the upper-buried region 53 provided on the upper surface of the lower-buried region 43 so as to be in contact with the lower-buried region 43.

Figure 9:
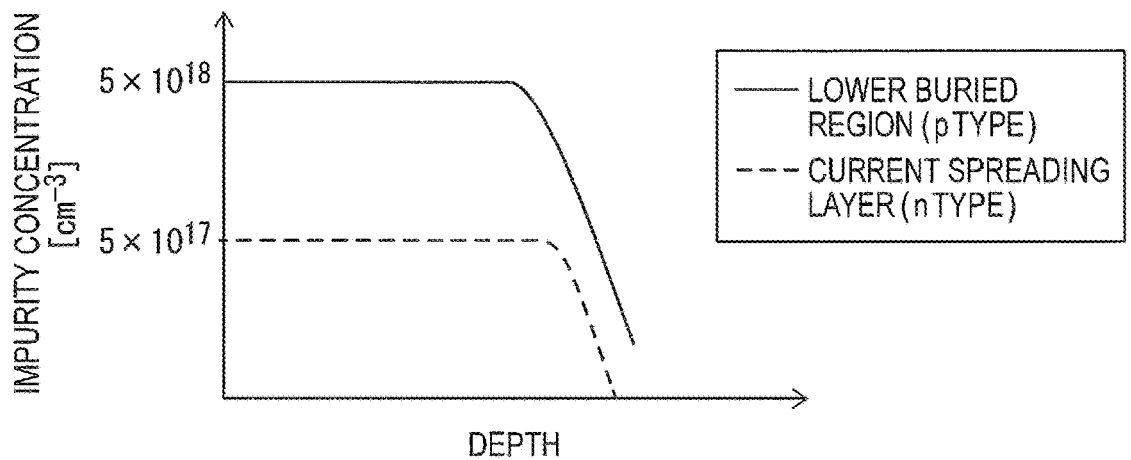
FIG. 9 is a graph illustrating an impurity concentration profile of a portion of a lower-buried region of the insulated-gate semiconductor device according to the comparative example in the depth direction.

FIG. 9 illustrates a profile of the impurity concentration of the portion of the lower-buried region 41 illustrated in FIG. 7 in the depth direction. The profile of the n-type impurities corresponding to the current spreading layer 3 is constant at about $1 \times 10^{17}$ cm$^{-3}$ in the depth direction. The profile of the p-type impurities corresponding to the lower-buried region 41 is constant at about $5 \times 10^{18}$ cm$^{-3}$ in the depth direction.

In the insulated-gate semiconductor device according to the comparative example, in order to facilitate the flow of the avalanche current in the base-bottom buried-regions (41, 51; 42, 52; 43, 53), high-concentration n$^+$-type partial current spreading layers 31, 32, and 33 are provided so as to be in contact with the bottom surfaces of the lower-buried regions 41a, 42a, and 43a. On the other hand, according to the insulated-gate semiconductor device of the embodiment, the base-bottom buried-regions (41a, 41b, 51; 42a, 42b, 52; 43a, 43b, 53) are separated by an impurity profile, in which a portion of the current spreading layer 3 is interposed in the depth direction. Therefore, since the avalanche current relatively easily flow in the lower-buried regions 41a, 42a, and 43a, the partial current spreading layers 31, 32, and 33 are not necessarily provided unlike the insulated-gate semiconductor device according to the comparative Example.

Figure 10A:
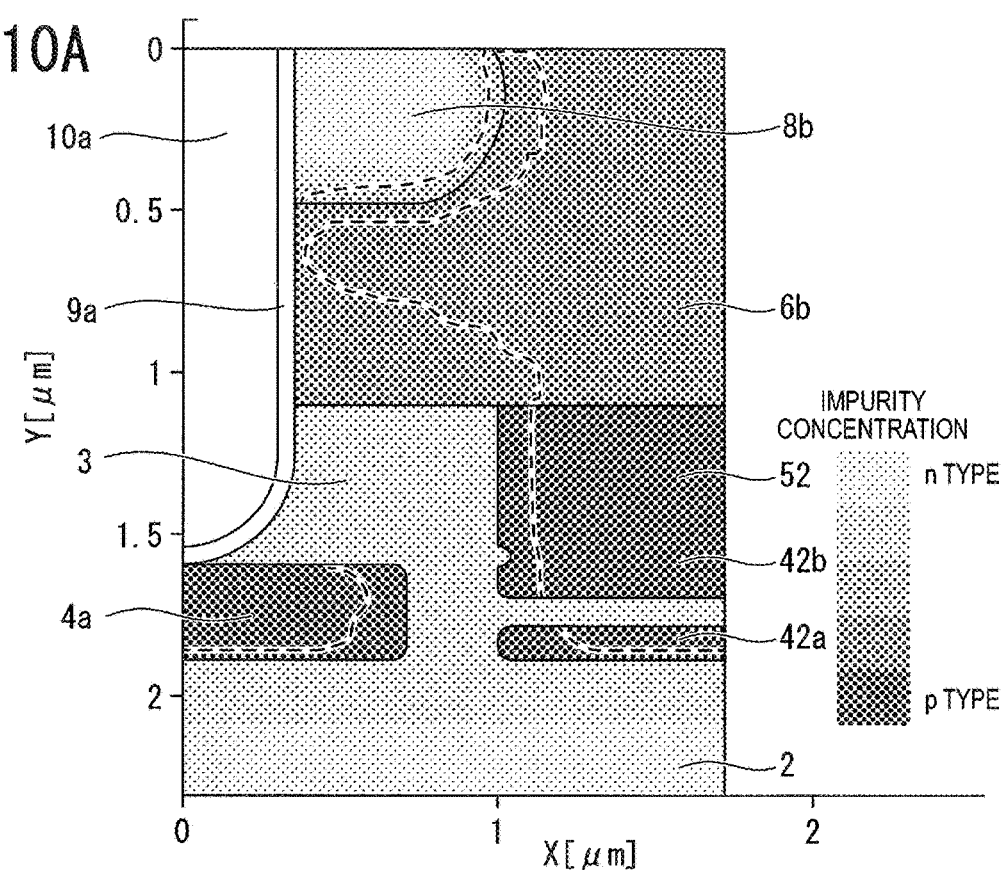
FIG. 10A is a graph illustrating a simulated result of impurity concentration of an insulated-gate semiconductor device according to an embodiment of the present invention.
Figure 10B:
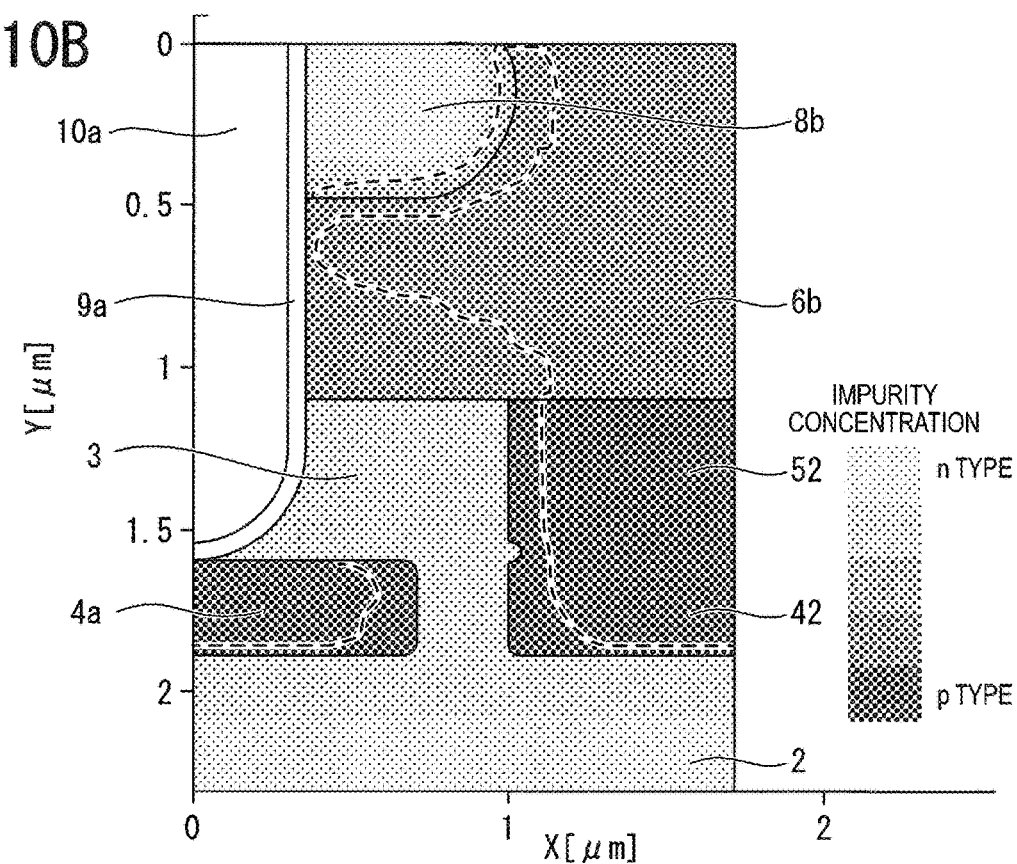
FIG. 10B is a graph illustrating a simulated result of impurity concentration of an insulated-gate semiconductor device according to a first comparative example.

Next, a simulated result of the insulated-gate semiconductor device according to the embodiment will be described with reference to FIGS. 10A to 12C. Here, the simulated result of the insulated-gate semiconductor device according to the embodiment is compared with the insulated-gate semiconductor device according to a first example and the insulated-gate semiconductor device according to a second example. FIGS. 10A to 10C illustrate, stepwise by hatching, the magnitudes of the impurity concentrations of the insulated-gate semiconductor device according to the embodiment, the insulated-gate semiconductor device according to the first comparative example, and the insulated-gate semiconductor device according to the second comparative example, respectively. The broken lines in FIGS. 10A to 10C indicate extension of the depletion layer.

As illustrated in FIG. 10A, the insulated-gate semiconductor device according to the embodiment has a structure in which the base-bottom buried-region (42a, 42b, 52) is separated in the depth direction with a portion of the current spreading layer 3 interposed. As illustrated in FIG. 10B, the insulated-gate semiconductor device according to the first comparative example is different from the insulated-gate semiconductor device according to the embodiment in that the base-bottom buried-region (42, 52) is continuous in the depth direction. As illustrated in FIG. 10C, similarly to the insulated-gate semiconductor device according to the first comparative example, the insulated-gate semiconductor device according to the second comparative example is different from the insulated-gate semiconductor device according to the embodiment in that the base-bottom buried-region (42, 52) is continuous in the depth direction. Furthermore, the insulated-gate semiconductor device according to the second comparative example is different from the insulated-gate semiconductor device according to the embodiment in that the gate-bottom protection-region 4a is smaller in depth than the base-bottom buried-region (42, 52).

Figure 11A:
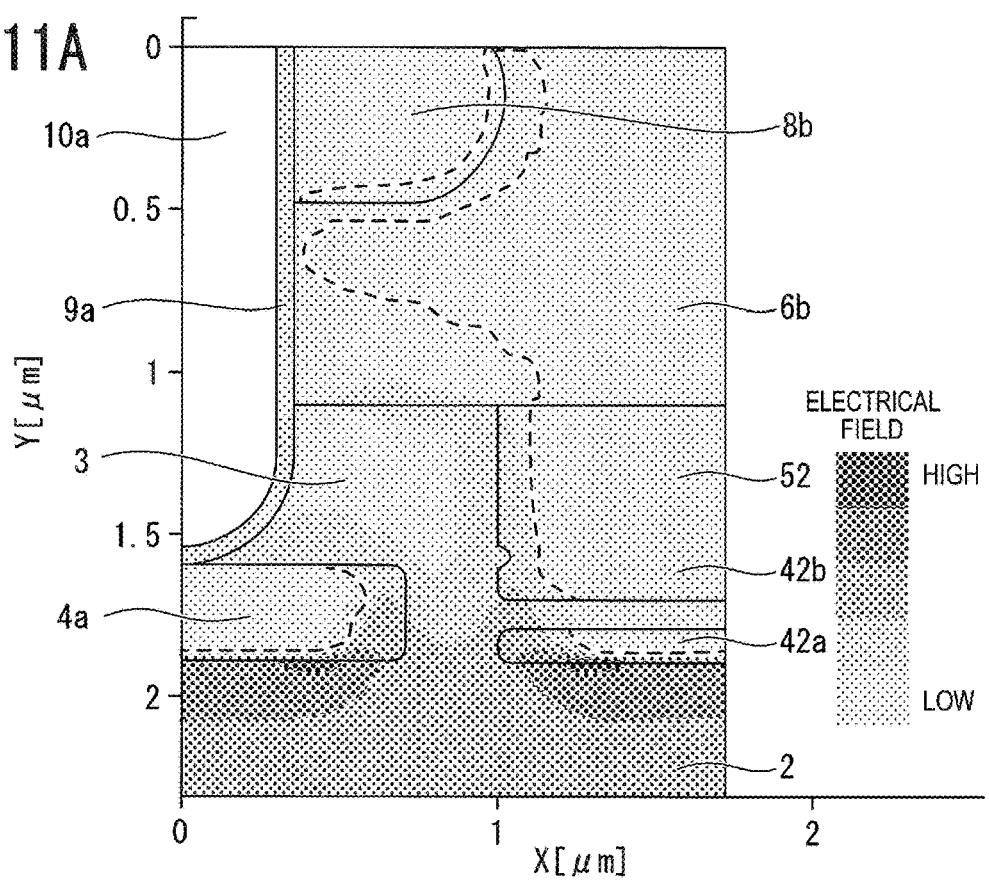
FIG. 11A is a graph illustrating a simulated result of electric field when a reverse bias is applied to the insulated-gate semiconductor device according to the embodiment of the present invention.
Figure 11B:
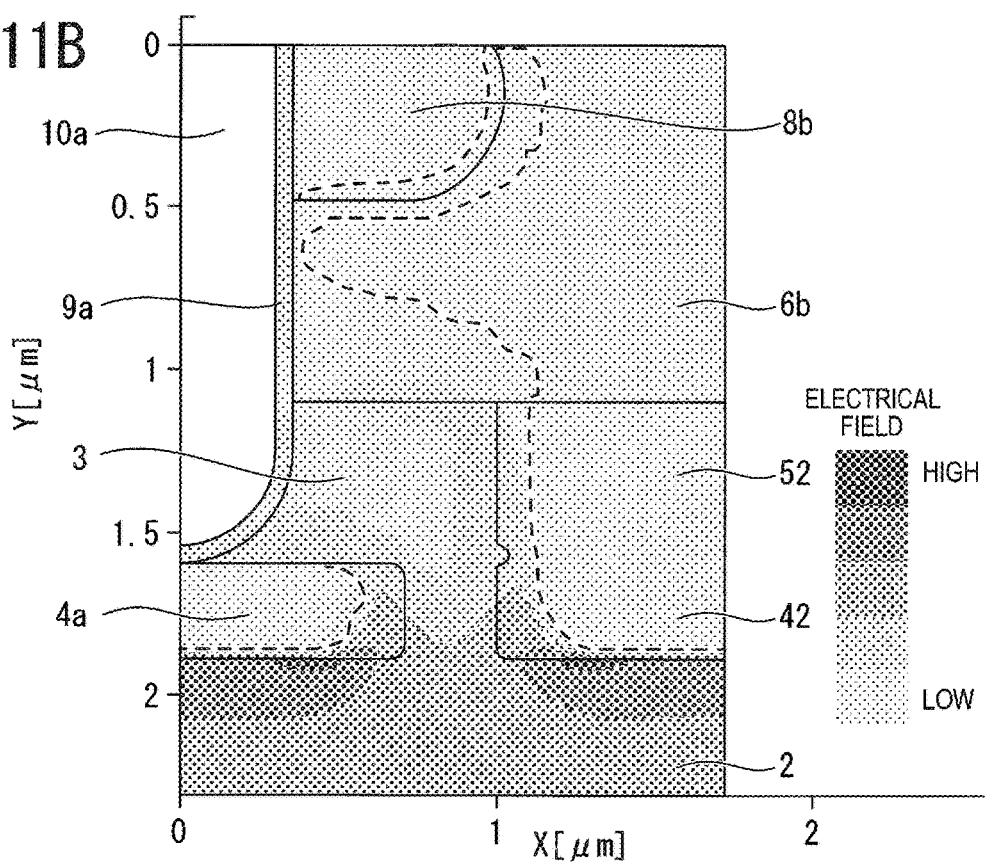
FIG. 11B is a graph illustrating a simulated result of electric field when a reverse bias is applied to the insulated-gate semiconductor device according to the first comparative example.
Figure 11C:
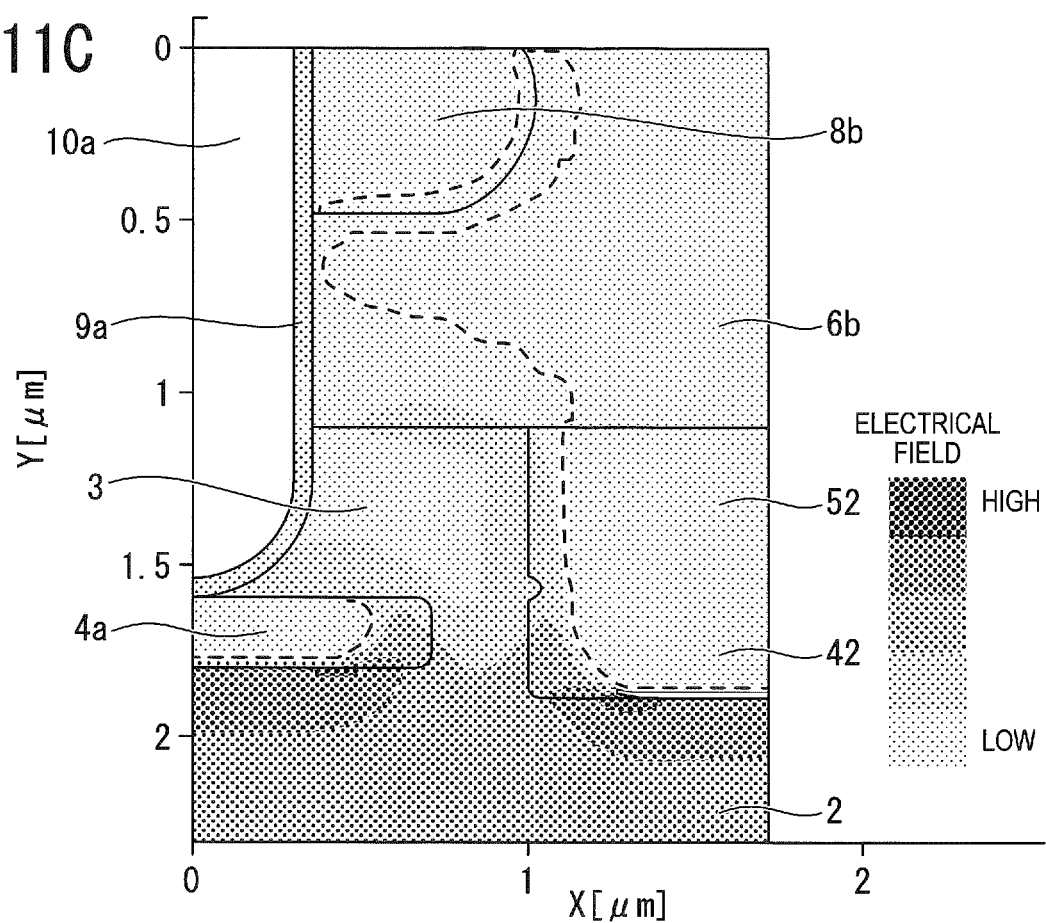
FIG. 11C is a graph illustrating a simulated result of electric field when a reverse bias is applied to the insulated-gate semiconductor device according to the second comparative example.

FIGS. 11A to 11C illustrate, stepwise by hatching, the intensities of the electric fields when a reverse bias is applied to the insulated-gate semiconductor device according to the embodiment, the insulated-gate semiconductor device according to the first comparative example, and the insulated-gate semiconductor device according to the second comparative example, respectively. In the insulated-gate semiconductor device according to the embodiment illustrated in FIG. 11A, the electric field is evenly concentrated on both the gate-bottom protection-region 4a and the lower-buried region 42a. Even in the insulated-gate semiconductor device according to the first comparative example illustrated in FIG. 11B, the electric field is concentrated on both the gate-bottom protection-region 4a and the lower-buried region 42. On the other hand, in the insulated-gate semiconductor device according to the second comparative example illustrated in FIG. 11C, since the lower-buried region 42 is deeper than the gate-bottom protection-region 4a, the electric field is locally concentrated on the lower-buried region 42.

Figure 12C:
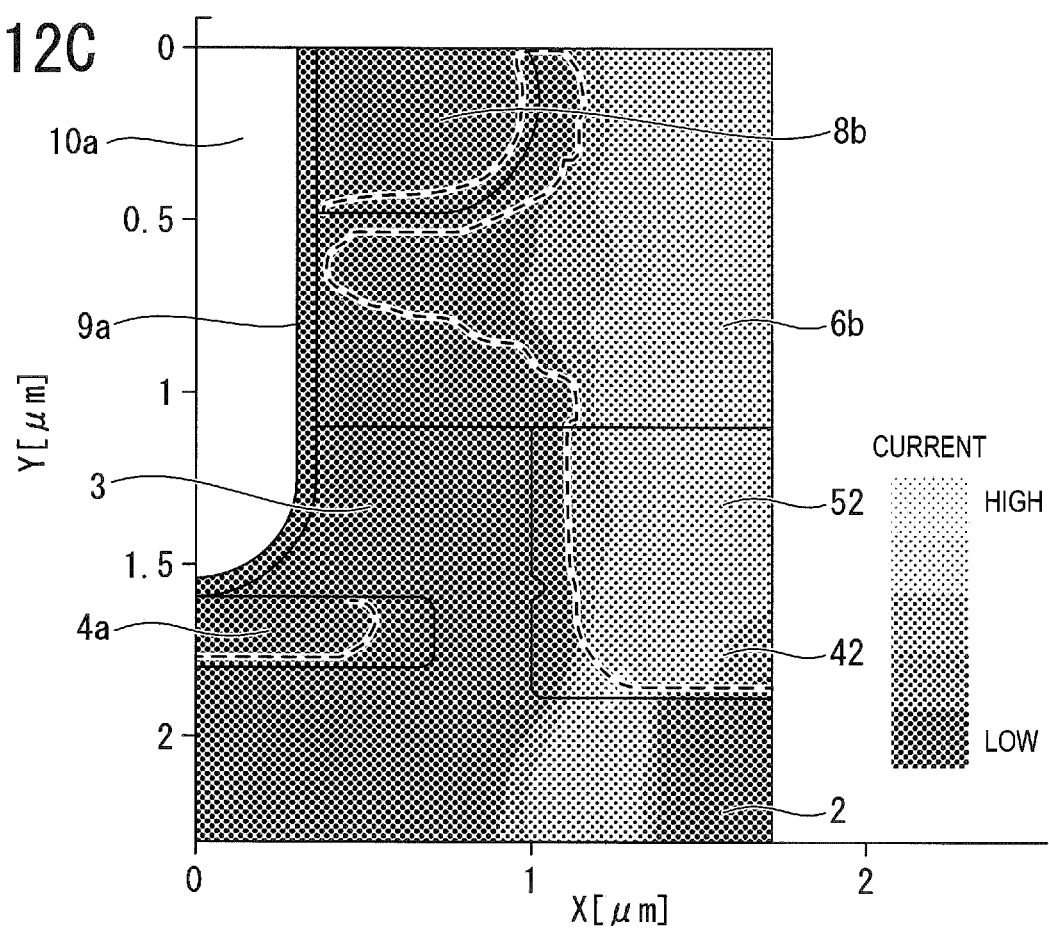
FIG. 12C is a graph illustrating a simulated result of current when a reverse bias is applied to the insulated-gate semiconductor device according to the second comparative example.

FIGS. 12A to 12C illustrate, stepwise by hatching, the magnitudes of the currents when a reverse bias is applied to the insulated-gate semiconductor device according to the embodiment, the insulated-gate semiconductor device according to the first comparative example, and the insulated-gate semiconductor device according to the second comparative example, respectively. In the insulated-gate semiconductor device according to the embodiment illustrated in FIG. 12A, an avalanche current does not flow in the gate-bottom protection-region 4a, and an avalanche current flows only in the lower-buried region 42a. In the insulated-gate semiconductor device according to the first comparative example illustrated in FIG. 12B, an avalanche current flows not only in the lower-buried region 42 but also in the gate-bottom protection-region 4a. In the insulated-gate semiconductor device according to the second comparative example illustrated in FIG. 12C, an avalanche current does not flow in the gate-bottom protection-region 4a, and an avalanche current flows only on the lower-buried region 42 side.

Next, the method of manufacturing the insulated-gate semiconductor device according to the embodiment will be described with reference to FIGS. 13 to 26, by setting the case of the trench gate MISFET as an example while focusing on a cross section of the insulated-gate semiconductor device illustrated in FIG. 1. In addition, the method of manufacturing the trench gate MISFET described below is merely an example and can be realized by various other manufacturing methods including this modified example within the scope of the spirit disclosed in the claims.

Figure 13:
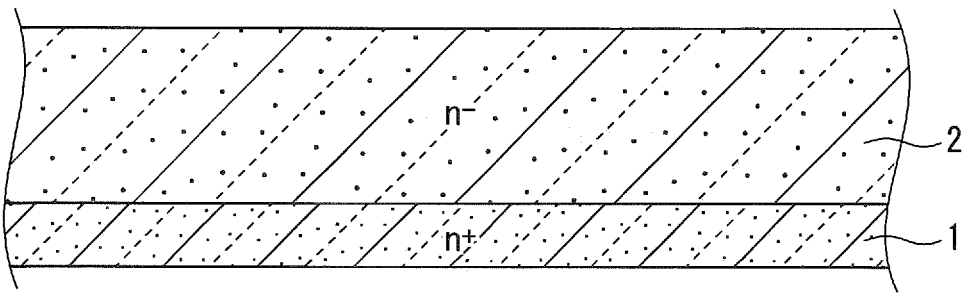
FIG. 13 is a process cross-sectional view for describing an example of a method of manufacturing an insulated-gate semiconductor device according to an embodiment of the present invention.
Figure 14:
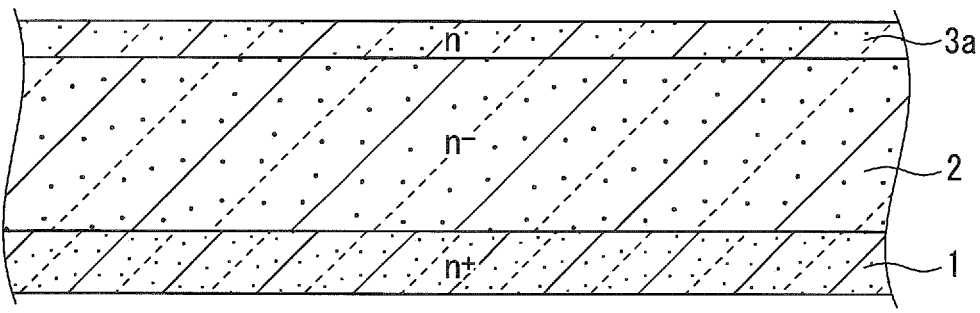
FIG. 14 is a process cross-sectional view continued from FIG. 13 for describing the example of the method of manufacturing the insulated-gate semiconductor device according to the embodiment of the present invention.

First, an n$^+$-type semiconductor substrate (SiC substrate) doped with n-type impurities such as nitrogen (N) is prepared. As illustrated in FIG. 13, by using the n$^+$-type SiC substrate as the drain region 1, the n$^-$-type drift layer 2 is epitaxially grown on the upper surface of the drain region 1. Next, n-type impurity ions such as nitrogen (N) are implanted with multiple acceleration energies on the upper surface of the drift layer 2. After that, as illustrated in FIG. 14, an n-type first current spreading layer 3a is formed by activating the implanted n-type impurity ions through annealing. In addition, the n-type first current spreading layer 3a may be epitaxially grown on the upper surface of the drift layer 2.

Next, a photoresist film is coated on the upper surface of the first current spreading layer 3a, and the photoresist film is delineated by a photolithography technique. By using the delineated photoresist film as a mask for ion implantation, p-type impurity ions such as Al are implanted at a first acceleration energy into portions where the lower-buried region 41a of the lower layer, the lower-buried region 42a of the lower layer, and the lower-buried region 43a of the lower layer are to be formed, referring to FIGS. 1, 5 and 6. At this time, p-type impurity ions are also implanted into portions corresponding to the gate-bottom protection-regions 4a and 4b.

Next, p-type impurity ions are implanted at a second acceleration energy obtained by lowering the acceleration energy of implantation from the first acceleration energy into the portion where the lower-buried region 41b of the upper layer, the lower-buried region 42b of the upper layer, and the lower-buried region 43b of the upper layer are to be formed. At this time, p-type impurity ions are also implanted into portions corresponding to the gate-bottom protection-regions 4a and 4b. Since the distribution of the projection range of ion implantation in SiC is almost a Gaussian distribution, by double stage implantation at the first and the second acceleration energies, two Gaussian distributions of the projection ranges as illustrated in FIG. 2 are formed to be separated.

In the double stage implantation at the first and second acceleration energies, with respect to the portion of the gate-bottom protection-regions 4a and 4b, the number of stages of the multi-stage ion implantation which is normally performed is reduced. Therefore, after removal of the mask for ion implantation for forming the two Gaussian distributions, a photoresist film is further coated, and the photoresist film is delineated by a photolithography technique. By using the delineated photoresist film as a mask for ion implantation, p-type impurity ions are implanted into the portions where the gate-bottom protection-regions 4a and 4b are formed in an inner portion the first current spreading layer 3a so as to supplement the portions thinned out at the time of the previous ion implantation. After removal of the mask for ion implantation, annealing is performed to activate the implanted p-type impurity ions.

Figure 15:
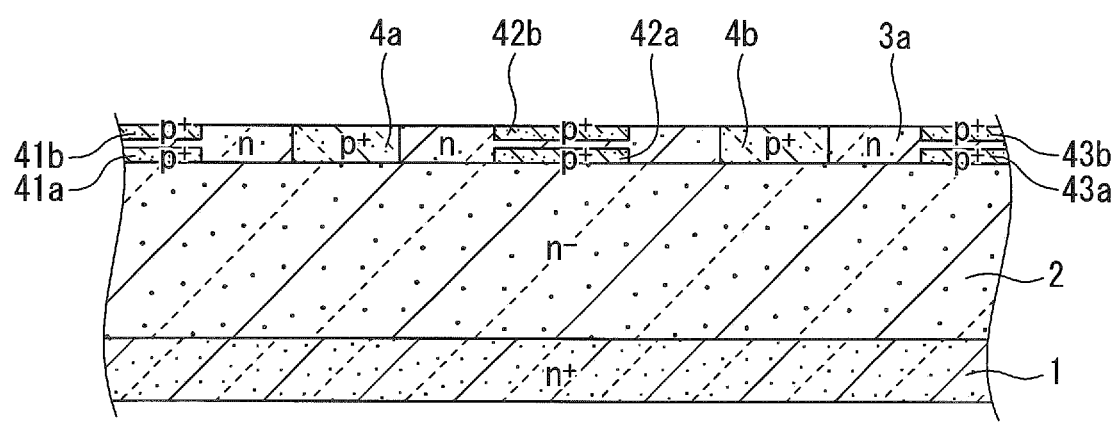
FIG. 15 is a process cross-sectional view continued from FIG. 14 for describing the example of the method of manufacturing the insulated-gate semiconductor device according to the embodiment of the present invention.

Since the diffusion coefficient of impurities in SiC is smaller than that of Si, the first Gaussian profile of the p-type impurity elements in the lower lower-buried region 41a, the lower lower-buried region 42a, and the lower lower-buried region 43a are substantially defined by the respective projection ranges of ion implantation. On the first Gaussian profile, the upper lower-buried region 41b, the upper lower-buried region 42b, and the upper lower-buried region 43b in which p-type impurity elements are distributed in the second Gaussian profile are formed. By adjusting the first and second acceleration energies while taking into consideration the standard deviations of the Gaussian profile s, the peak of the first Gaussian profile and the peak of the second Gaussian profile can be separated. As a result, as illustrated in FIG. 15, the lower-buried regions 41a and 41b, the lower-buried regions 42a and 42b, and the lower-buried regions 43a and 43b are selectively formed so as to interpose the first current spreading layer 3a in the depth direction. At the same time, the p$^+$-type gate-bottom protection-regions 4a and 4b are selectively formed in an inner portion of the first current spreading layer 3a.

Figure 16:
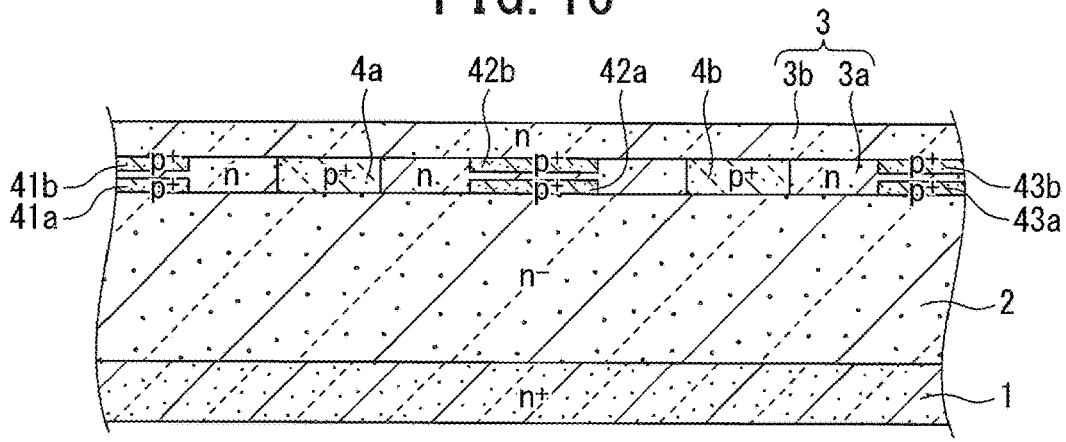
FIG. 16 is a process cross-sectional view continued from FIG. 15 for describing the example of the method of manufacturing the insulated-gate semiconductor device according to the embodiment of the present invention.
Figure 17:
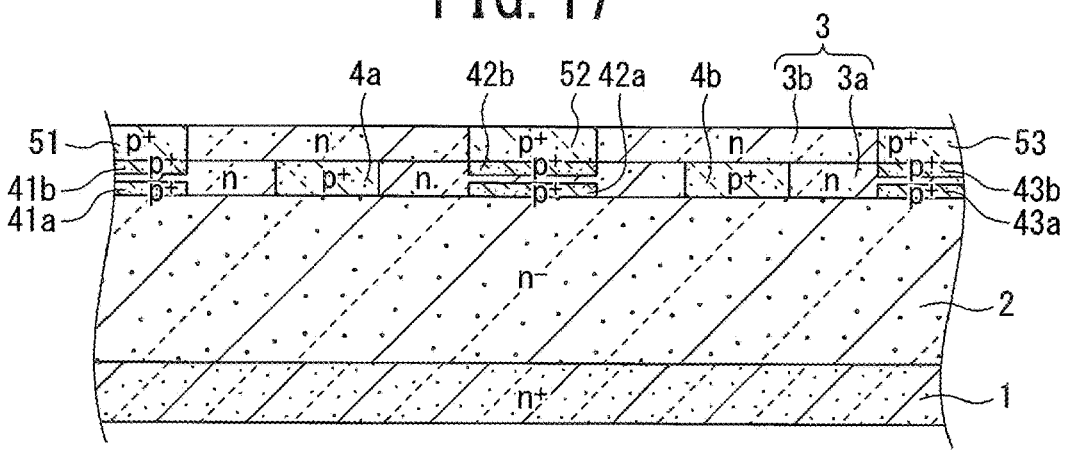
FIG. 17 is a process cross-sectional view continued from FIG. 16 for describing the example of the method of manufacturing the insulated-gate semiconductor device according to the embodiment of the present invention.

Next, as illustrated in FIG. 16, an n-type second current spreading layer 3b having the same impurity concentration as that of the first current spreading layer 3a is epitaxially grown on the upper surface of the first current spreading layer 3a, and the current spreading layer 3 is implemented by the first current spreading layer 3a and the second current spreading layer 3b. Then, a photoresist film is coated on the upper surface of the current spreading layer 3, and the photoresist film is delineated by a photolithography technique. By using the delineated photoresist film as a mask for ion implantation, p-type impurity ions such as Al are implanted with multiple acceleration energies. After removal of the mask for ion implantation, annealing is performed to activate the implanted p-type impurity ions. As a result, as illustrated in FIG. 17, p$^+$-type upper-buried regions 51, 52, and 53 are selectively formed in upper portions of the current spreading layer 3. In this manner, the base-bottom buried-regions (41a, 41b, 51; 42a, 42b, 52; 43a, 43b, 53) are formed so as to interpose a portion of the current spreading layer 3 in the depth direction.

In addition, instead of implementing the current spreading layer 3 by the first current spreading layer 3a and the second current spreading layer 3b by sequentially epitaxially growing the first current spreading layer 3a and the second current spreading layer 3b, the current spreading layer 3 may be stacked by epitaxially growing at one time. After that, similarly to the portions forming the gate-bottom protection-regions 4a and 4b and the base-bottom buried-regions (41a, 41b, 51; 42a, 42b, 52; 43a, 43b, 53) in inner portions of the current spreading layer 3, ions are implanted with multiple acceleration energies. The gate-bottom protection-regions 4a and 4b and the base-bottom buried-regions (41a, 41b, 51; 42a, 42b, 52; 43a, 43b, 53) may be formed by activating the p-type impurity ions through subsequent annealing.

Figure 18:
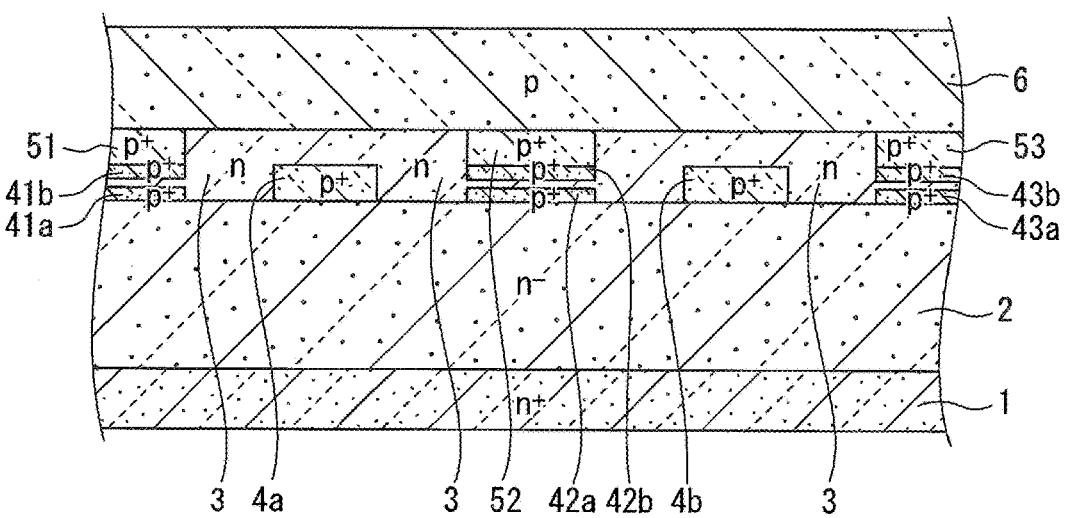
FIG. 18 is a process cross-sectional view continued from FIG. 17 for describing the example of the method of manufacturing the insulated-gate semiconductor device according to the embodiment of the present invention.
Figure 19:
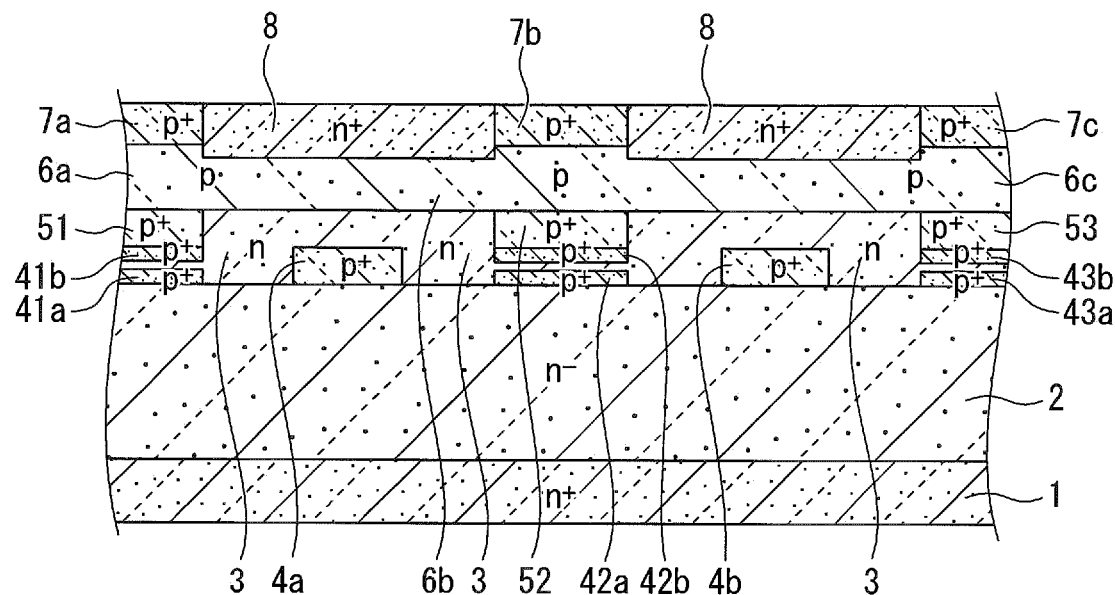
FIG. 19 is a process cross-sectional view continued from FIG. 18 for describing the example of the method of manufacturing the insulated-gate semiconductor device according to the embodiment of the present invention.

Next, as illustrated in FIG. 18, a p-type base region 6 is epitaxially grown on the upper surface of the current spreading layer 3. Next, a photoresist film is coated on the upper surface of the base region 6, and the photoresist film is delineated by a photolithography technique. By using the delineated photoresist film as a mask for ion implantation, n-type impurity ions such as N are implanted with multiple acceleration energies. After removal of the mask for ion implantation, a photoresist film is newly coated on the base region 6 by a photolithography technique, and the photoresist film is delineated by a photolithography technique. By using the delineated photoresist film as a mask for ion implantation, p-type impurity ions such as Al are implanted with multiple acceleration energies. After removal of the mask for ion implantation, annealing is performed to activate the implanted n-type impurity ions and p-type impurity ions. As a result, as illustrated in FIG. 19, an n$^+$-type source region 8 and p$^+$-type base-contact regions 7a to 7c are selectively formed in an upper portion of the base region 6.

In addition, the case where annealing is performed every time when performing ion implantation for forming the gate-bottom protection-regions 4a and 4b, the base-bottom buried-regions (41a, 41b, 51; 42a, 42b, 52; 43a, 43b, 53), the source region 8, and the base-contact regions 7a to 7c is exemplified, but the annealing may not be necessarily performed every time when performing ion implantation. For example, after performing ion implantation for forming the gate-bottom protection-regions 4a and 4b, the base-bottom buried-regions (41a, 41b, 51; 42a, 42b, 52; 43a, 43b, 53), the source region 8, and the base-contact regions 7a to 7c, the respective ion implantation regions may be collectively activated by one-time annealing.

Figure 20:
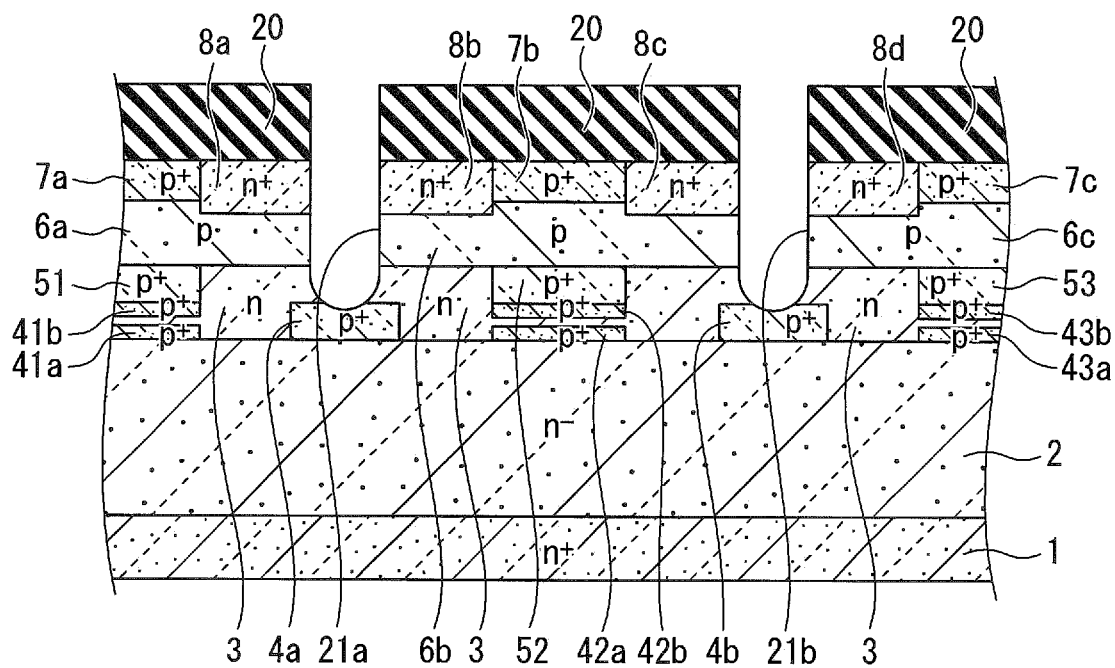
FIG. 20 is a process cross-sectional view continued from FIG. 19 for describing the example of the method of manufacturing the insulated-gate semiconductor device according to the embodiment of the present invention.

Next, a photoresist film 20 is coated on the upper surfaces of the source region 8 and the base-contact regions 7a to 7c, and the photoresist film 20 is patterned by a photolithography technique. As illustrated in FIG. 20, by using the delineated photoresist film 20 as a mask for etching, the trenches 21a and 21b are selectively formed by dry etching such as reactive ion etching (RIE) or the like. The trenches 21a and 21b penetrate the source regions 8a to 8d and the base regions 6a to 6c and reach the upper portion of the current spreading layer 3. After that, the photoresist film 20 is removed.

Figure 21:
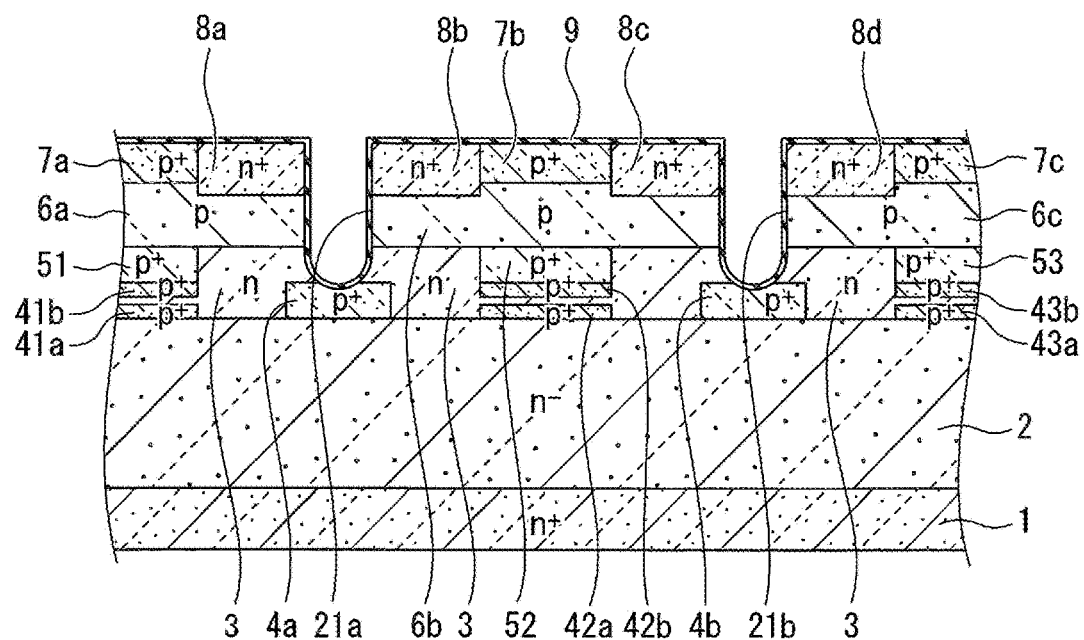
FIG. 21 is a process cross-sectional view continued from FIG. 20 for describing the example of the method of manufacturing the insulated-gate semiconductor device according to the embodiment of the present invention.
Figure 22:
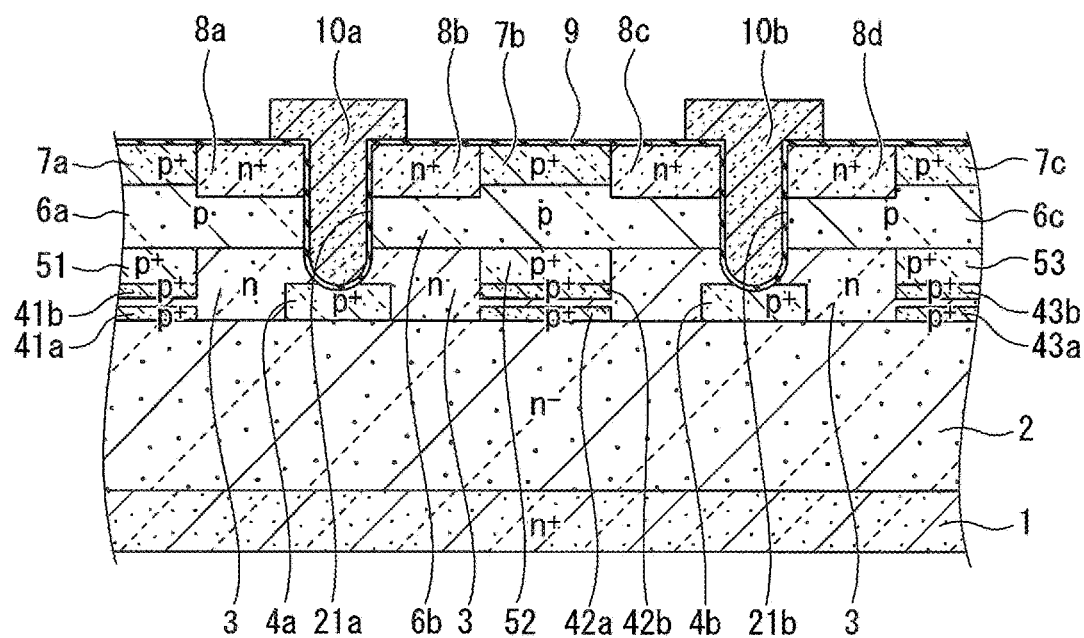
FIG. 22 is a process cross-sectional view continued from FIG. 21 for describing the example of the method of manufacturing the insulated-gate semiconductor device according to the embodiment of the present invention.

Next, as illustrated in FIG. 21, by a thermal oxidation method, a chemical vacuum evaporation (CVD), or the like, a gate insulating film 9 such as an SiO$_2$ film is formed on the bottom surfaces and side surfaces of the trenches 21a and 21b and the upper surfaces of the source regions 8a to 8d and the p$^+$-type base-contact regions 7a to 7c. Next, a polysilicon layer, which is heavily doped with impurities such as phosphorus (P) at a high impurity concentration is deposited by a CVD method or the like so as to bury the trenches 21a and 21b. After that, by selectively removing a portion of the polysilicon layer by a photolithography technique and dry etching, as illustrated in FIG. 22, patterns of gate electrodes 10a and 10b implemented by a polysilicon layer are delineated, so that an insulated-gate electrode structure (9, 10a, 10b) is formed.

Figure 23:
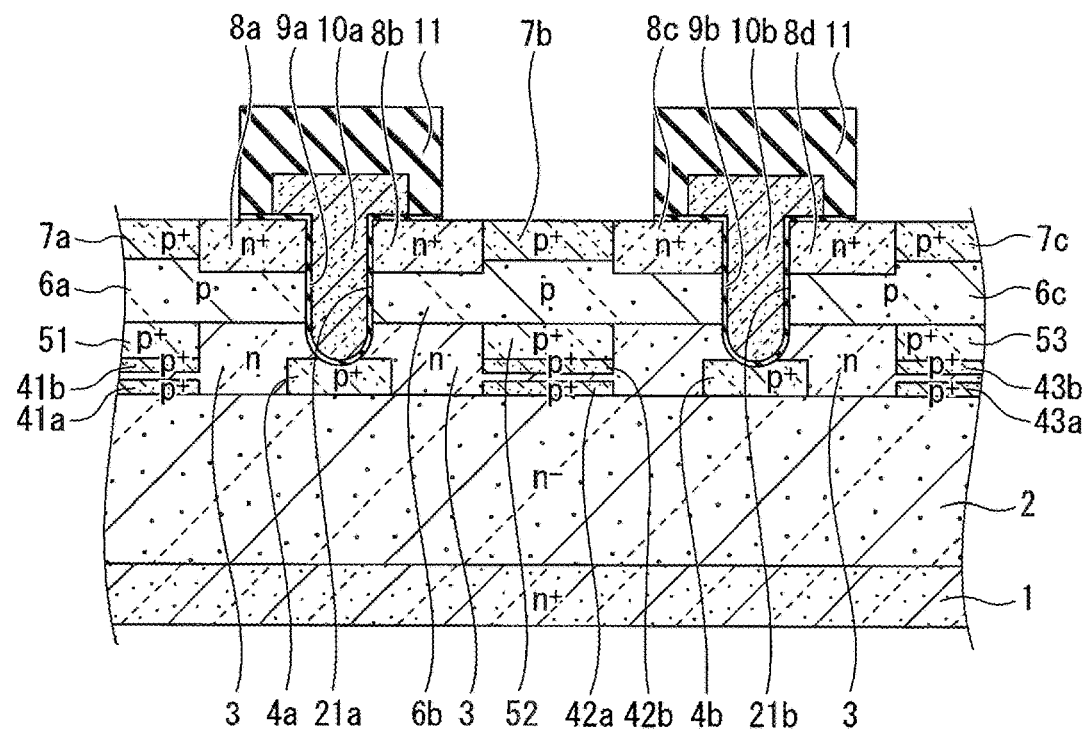
FIG. 23 is a process cross-sectional view continued from FIG. 22 for describing the example of the method of manufacturing the insulated-gate semiconductor device according to the embodiment of the present invention.

Next, an interlayer insulating film 11 is deposited on the upper surfaces of the insulated-gate electrode structures (9, 10a, 10b), which is implemented by the gate insulating film 9 and the gate electrodes 10a and 10b the gate insulating film 9, by a CVD method or the like. Then, as illustrated in FIG. 23, a portion of the interlayer insulating film 11 and the gate insulating film 9 is selectively removed by a photolithography technique and dry etching. As a result, source contact holes are cut in the interlayer insulating film 11 and the gate insulating film 9. Although not illustrated in the drawing, the gate contact hole is also cut in the interlayer insulating film 11 and the gate insulating film 9 so that a portion of the gate surface electrode connected to the gate electrodes 10a and 10b is exposed at a portion different from the source contact hole.

Figure 24:
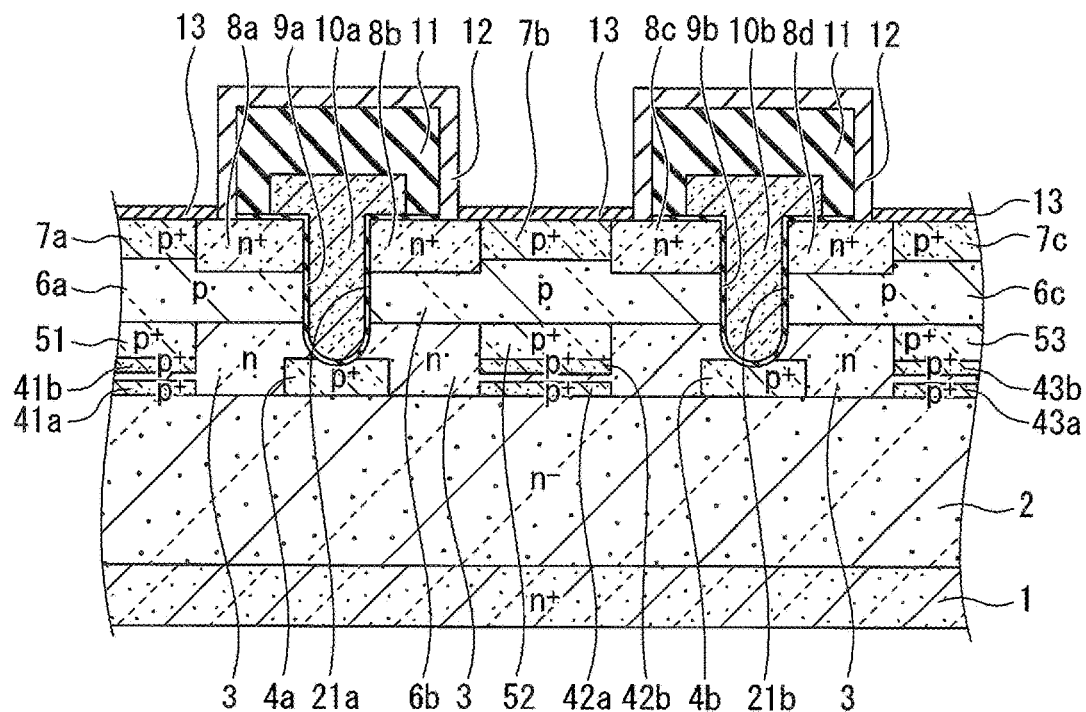
FIG. 24 is a process cross-sectional view continued from FIG. 23 for describing the example of the method of manufacturing the insulated-gate semiconductor device according to the embodiment of the present invention.

Next, a metallic layer such as a Ni film is deposited on the interlayer insulating film 11, the source regions 8a to 8d, and the base-contact regions 7a to 7c by a sputtering method, a vacuum evaporation method, or the like. Then, a source contact layer 13 is formed by delineating the metallic layer by using a photolithography technology, RIE, and the like and performing annealing at, for example, 1000° C. by rapid thermal processing (RTA). Next, a barrier metallic layer 12 is formed by depositing a metallic layer such as a TiN film by a sputtering method or the like and delineating the metallic layer by a photolithography technique and RIE or the like. As a result, as illustrated in FIG. 24, the source contact layer 13 is formed on the upper surfaces of the base-contact regions 7a to 7c and the source regions 8a to 8d, and the barrier metallic layer 12 is formed so as to cover the interlayer insulating film 11.

Next, a metallic layer such as an Al film is deposited on the barrier metallic layer 12 and the source contact layer 13 by a sputtering method or the like. A pattern of a source electrode 14 and a gate surface electrode (not illustrated) is formed by delineating the metallic layer such as an Al film by a photolithography technique and RIE or the like. As a result, the pattern of the source electrode 14 and the pattern of the gate surface electrode are separated. Next, the thickness of the drain region 1 which is a SiC substrate is adjusted by chemical mechanical polishing (CMP) or the like. After the adjustment of the SiC substrate, as illustrated in FIG. 1, a drain electrode 15 made of Au or the like is formed on the entire bottom surface of the drain region 1 by a sputtering method, a vacuum evaporation method, or the like. In this manner, the insulated-gate semiconductor device according to the embodiment is completed.

As described above, since the diffusion coefficient of the impurity in SiC is small, it is easy to realize the impurity profile having a plurality of peaks based on the Gaussian distribution as illustrated in FIG. 2 by selecting the acceleration energy at the time of ion implantation. According to the manufacturing method of the insulated-gate semiconductor device pertaining to the embodiment, by realizing the impurity profile as illustrated in FIG. 2, the avalanche current cannot easily flows in the bottoms of the trenches 21a and 21b while maintaining the breakdown voltage of the active area, and it is possible to easily realize the insulated-gate semiconductor device capable of protecting the gate insulating films 9a and 9b at the bottoms of the trenches 21a and 21b.

Modified Example

Figure 25:
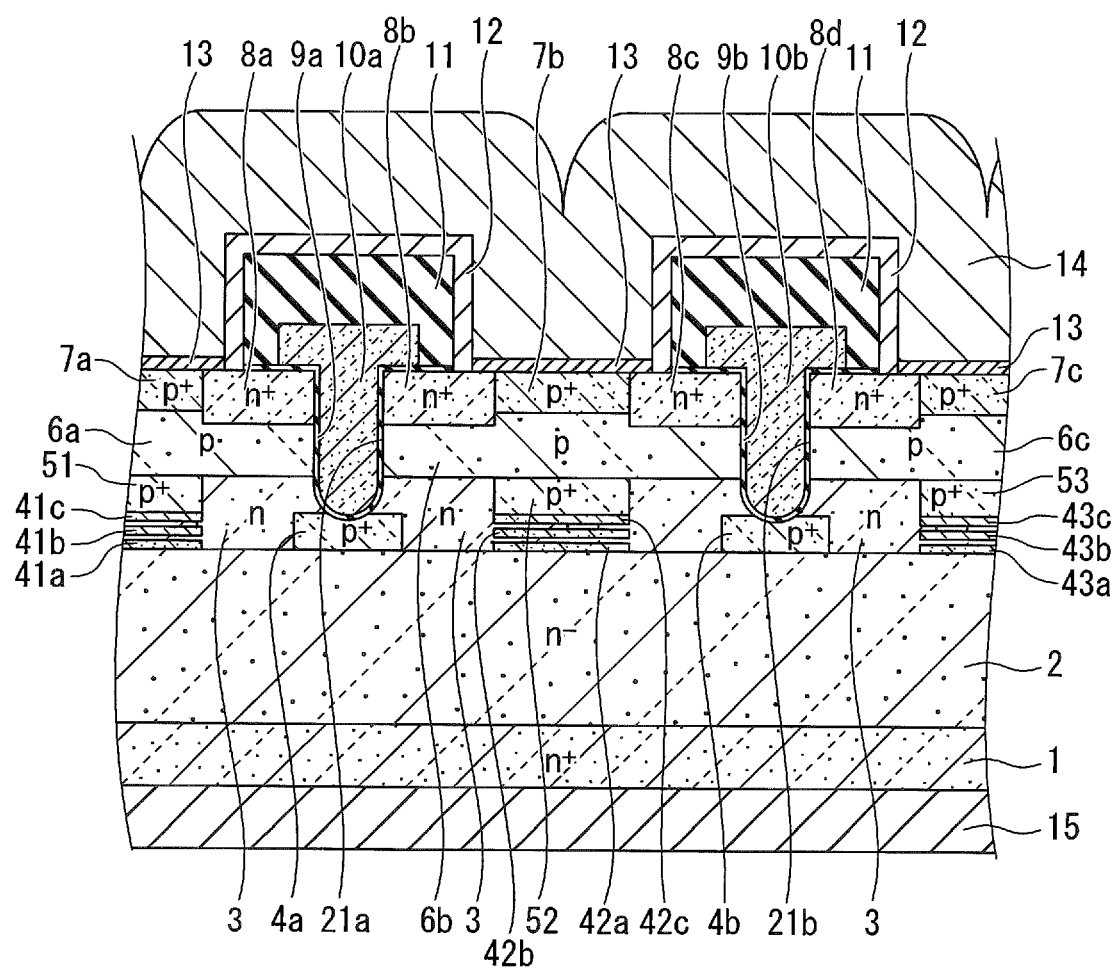
FIG. 25 is a cross-sectional view of main components illustrating an example of an insulated-gate semiconductor device according to a modified example of the embodiment of the present invention.
Figure 26:
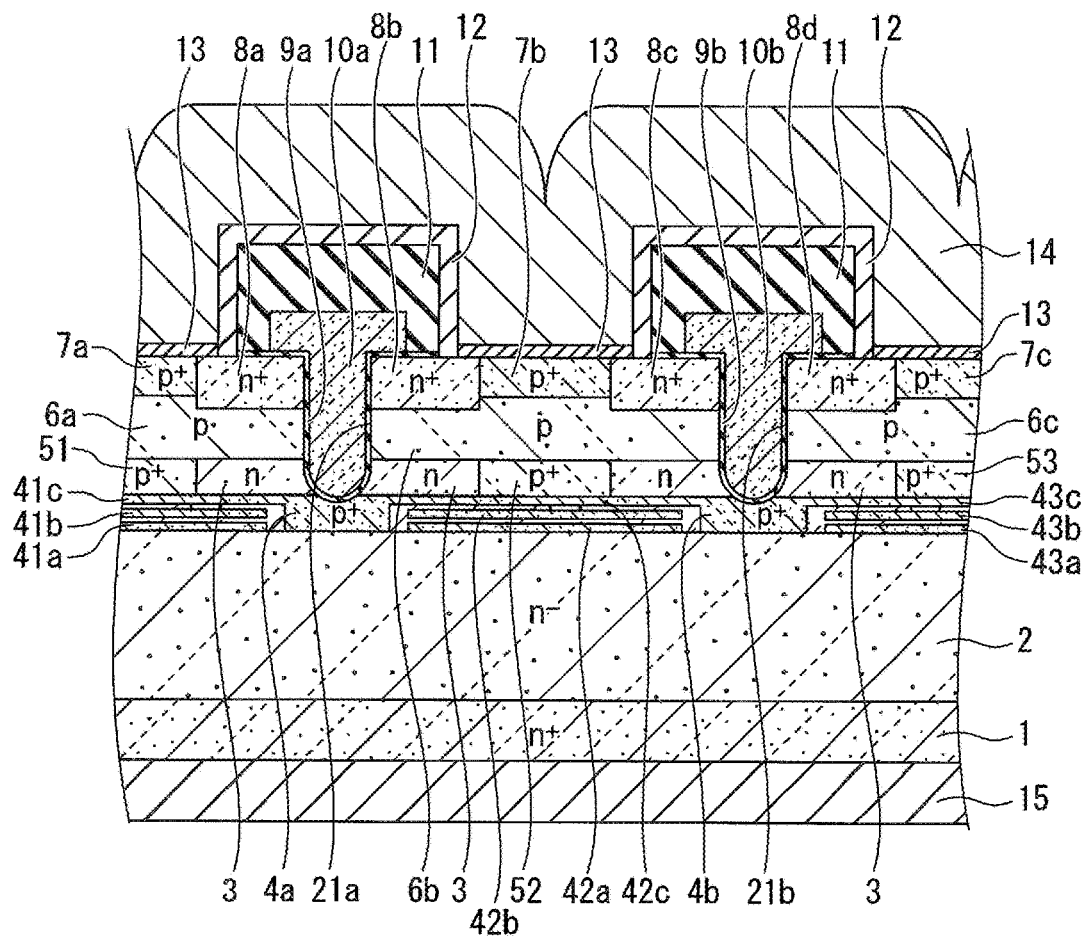
FIG. 26 is a cross-sectional view of main components illustrating the example of the insulated-gate semiconductor device according to the modified example of the embodiment of the present invention.

As illustrated in FIGS. 25 and 26, an insulated-gate semiconductor device according to a modified example of the embodiment of the present invention is different from the insulated-gate semiconductor device according to the embodiment in terms of the structure of the base-bottom buried-regions (41a, 41b, 41c, 51), (42a, 42b, 42c, 52), and (43a, 43b, 43c, 53). FIG. 25 corresponds to a cross-sectional view taken from the A-A direction in FIG. 3, and FIG. 26 corresponds to a cross-sectional view taken from the B-B direction in FIG. 3.

As illustrated in FIGS. 25 and 26, the base-bottom buried-region (41a, 41b, 41c, 51) includes the three layers of lower-buried regions 41a to 41c and the upper-buried region 51 arranged on the lower-buried regions 41a to 41c. The base-bottom buried-region (42a, 42b, 42c, 52) includes the three layers of lower-buried regions 42a to 42c and the upper-buried region 52 arranged on the lower-buried regions 42a to 42c. The base-bottom buried-region (43a, 43b, 43c, 53) includes the three layers of lower-buried regions 43a to 43c and the upper-buried region 53 arranged on the lower-buried regions 43a to 43c.

Each of the lower-buried regions 41a to 41c, the lower-buried regions 42a to 42c, and the lower-buried regions 43a to 43c is divided into three layers in the depth direction, which are separated from each other. A portion of the current spreading layer 3 is interposed between the lower-buried regions 41a, 42a, and 43a of the lowermost layer and the lower-buried regions 41b, 42b, and 43b of the intermediate layer and between the lower-buried regions 41b, 42b, and 43b of the intermediate layer and the lower-buried regions 41c, 42c, and 43c of the uppermost layer.

Figure 27:
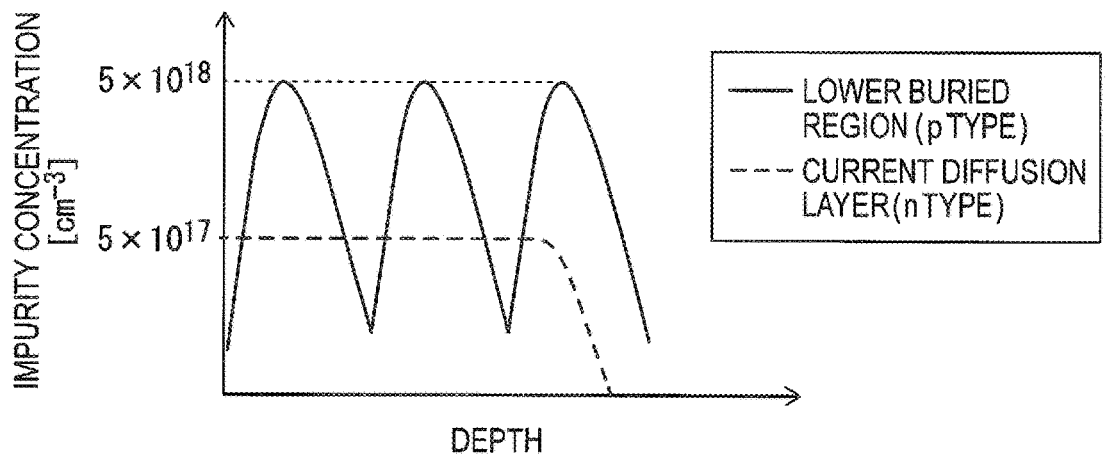
FIG. 27 is a graph illustrating an impurity concentration profile of a portion of a lower-buried region of the insulated-gate semiconductor device according to the modified example of the embodiment of the present invention in the depth direction.

FIG. 27 illustrates a profile of the impurity concentration of the lower-buried regions 41a to 41c illustrated in FIG. 25 in the depth direction. The profile of the n-type impurity corresponding to the current spreading layer 3 is constant at about $1 \times 10^{17}$ cm$^{-3}$. The profile of the p-type impurity corresponding to the lower-buried regions 41a to 41c has three peaks of about $5 \times 10^{18}$ cm$^{-3}$. At the position of the current spreading layer 3 between the lower-buried regions 41a and 41b and the current spreading layer 3 between the lower-buried regions 41b and 41c, the impurity concentration of the p-type impurity becomes lower than the impurity concentration of the n-type impurities. That is, a p-n-p-n-p structure is implemented by interposing the current spreading layer 3 between the lower-buried regions 41a to 41c.

As illustrated in FIG. 26, the lower-buried regions 41c, 42c, and 43c of the uppermost layer are connected to the gate-bottom protection-regions 4a and 4b. The lower-buried regions 41a, 42a, 43a in the lowermost layer and the lower-buried regions 41b, 42b, and 43b in the intermediate layer are separated from the gate-bottom protection-regions 4a and 4b and are potentially floating. Other configurations of the insulated-gate semiconductor device according to the modified example of the embodiment of the present invention are the same as those of the insulated-gate semiconductor device according to the embodiment, and thus, redundant description will be omitted.

According to the insulated-gate semiconductor device pertaining to the modified example of the embodiment of the present invention, even in a case where each of the lower-buried regions 41a to 41c, the lower-buried regions 42a to 42c, and the lower-buried regions 43a to 43c is divided into three layers in the depth direction, similarly to the embodiment of the present invention, an avalanche current is easy to flow in the lower-buried regions 41a to 41c, the lower-buried regions 42a to 42c, and the lower-buried regions 43a to 43c. Therefore, it is possible to protect the bottoms of the trenches 21a and 21b while maintaining the breakdown voltage of the active area. In addition, in the modified example of the embodiment of the present invention, the case where the lower-buried regions 41a to 41c, the lower-buried regions 42a to 42c, and the lower-buried regions 43a to 43c are divided into three layers in the depth direction is exemplified. However, these lower-buried regions may be divided into four or more layers in the depth direction.

In the method of manufacturing the insulated-gate semiconductor device according to the modified example of the embodiment of the present invention, in the ion implantation for forming the lower-buried regions 41a to 41c, the lower-buried regions 42a to 42c, and the lower-buried regions 43a to 43c, the number of stages of the multi-stage ion implantation is reduced so that the lower-buried regions 41a to 41c, the lower-buried regions 42a to 42c, and the lower-buried regions 43a to 43c are separated. Other processes are the same as those of the method of manufacturing the insulated-gate semiconductor device according to the embodiment, and thus, redundant description will be omitted.

Other Embodiments

As described above, the present invention has been described according to the embodiments, but it should not be understood that the description and drawings constituting a portion of this disclosure limit the present invention. From this disclosure, various alternative embodiments, examples, and operational techniques will be apparent to those skilled in the art.

Figure 28:
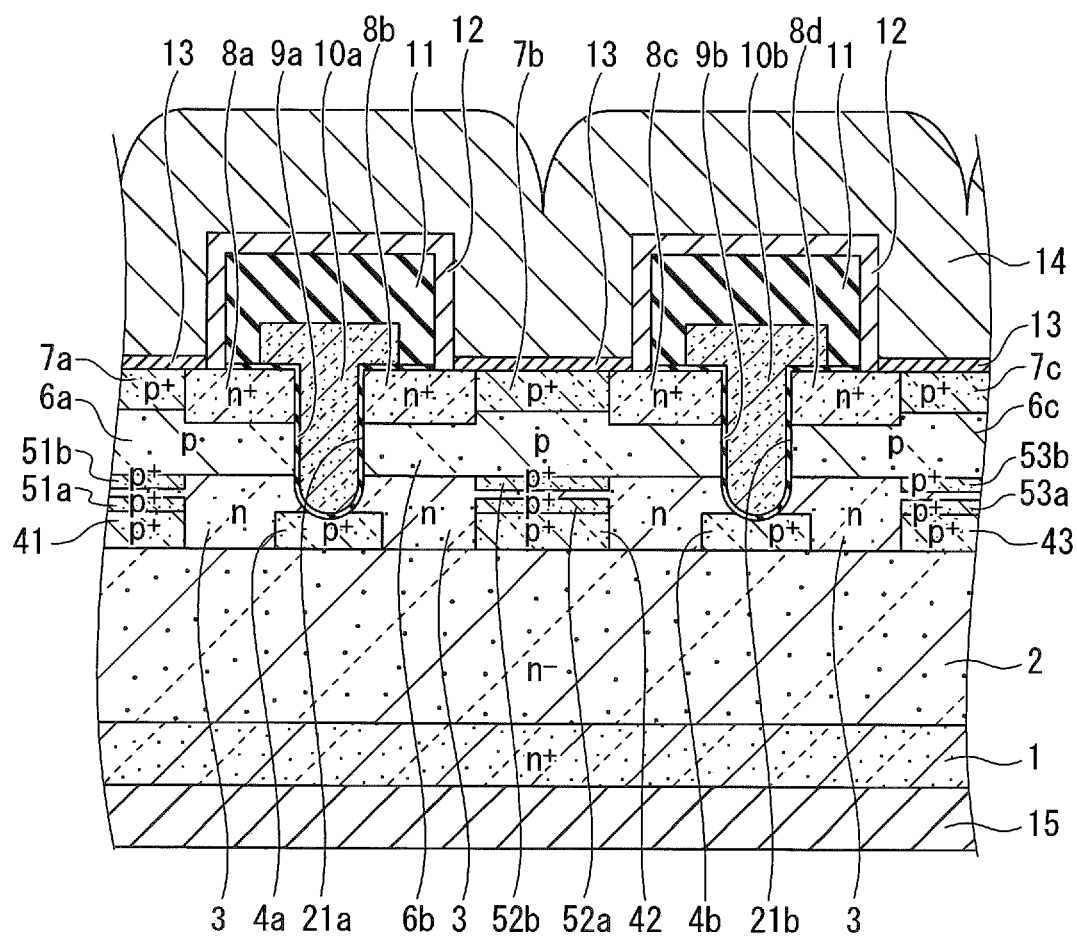
FIG. 28 is a cross-sectional view of main components illustrating an example of an insulated-gate semiconductor device according to another embodiment of the present invention.

For example, in the embodiment of the present invention, as illustrated in FIG. 1, there is exemplified the structure in which the lower-buried regions 41a and 41b, the lower-buried regions 42a and 42b, and the lower-buried regions 43a and 43b are divided in the depth direction. However, as illustrated in FIG. 28, the lower-buried regions 41, 42, and 43 may not be divided, but the upper-buried regions 51a and 51b, the upper-buried regions 52a and 52b, and the upper-buried regions 53a and 53b may be divided in the depth direction with a portion of the current spreading layer 3 interposed. In manufacturing the insulated-gate semiconductor device illustrated in FIG. 28, the number of stages of the multi-stage ion implantation in forming the upper-buried regions 51a and 51b, the upper-buried regions 52a and 52b, and the upper-buried regions 53a and 53b may be reduced.

Figure 29:
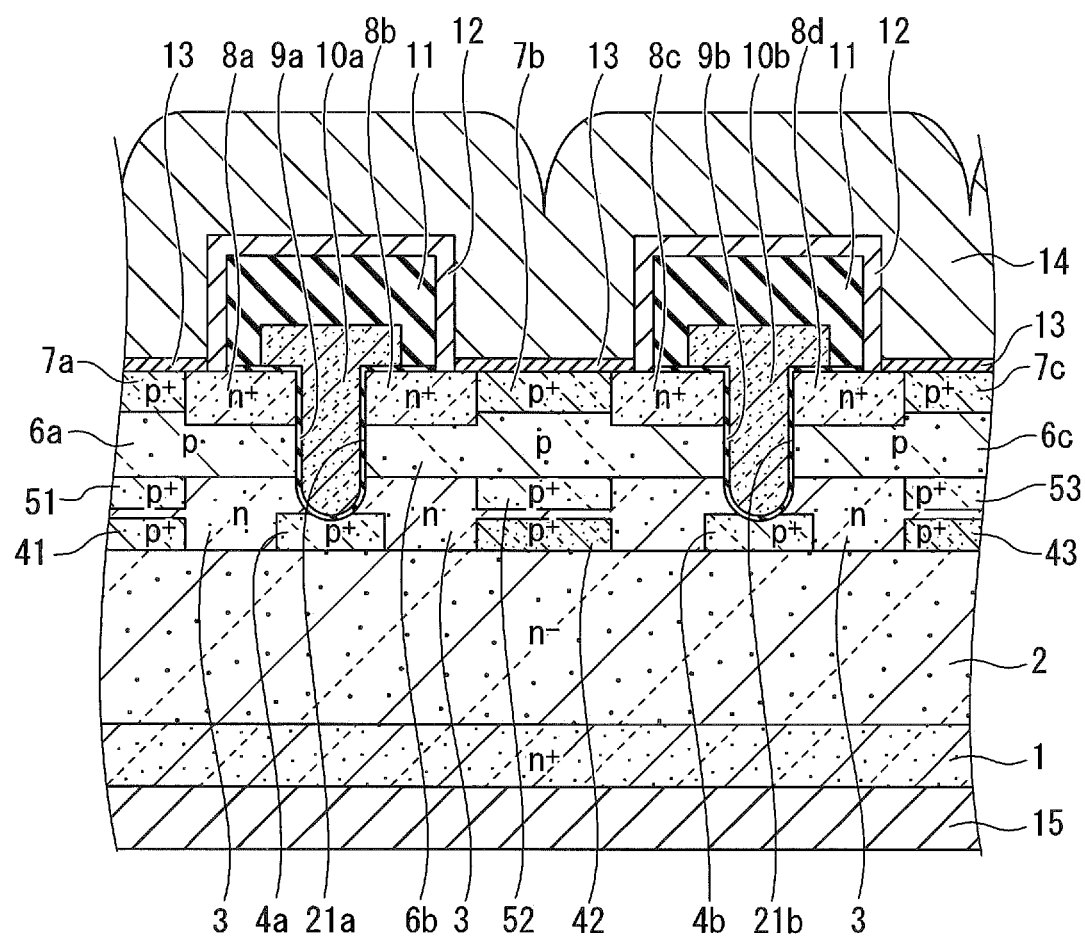
FIG. 29 is a cross-sectional view of main components illustrating another example of the insulated-gate semiconductor device according to another embodiment of the present invention.

In addition, without dividing any of the lower-buried regions 41, 42, and 43 and the upper-buried regions 51, 52, and 53, as illustrated in FIG. 29, the lower-buried regions 41, 42, and 43 and the upper-buried regions 51, 52, and 53 may be separated with a portion of the current spreading layer 3 interposed in the depth direction. In manufacturing the insulated-gate semiconductor device illustrated in FIG. 29, the number of stages in lower level acceleration energies of the multi-stage ion implantation for forming the lower-buried regions 41, 42, and 43 may be reduced. Alternatively, the number of stages in higher level acceleration energies of the multi-stage ion implantation for forming the upper-buried regions 51, 52, and 53 may be reduced.

Figure 30:
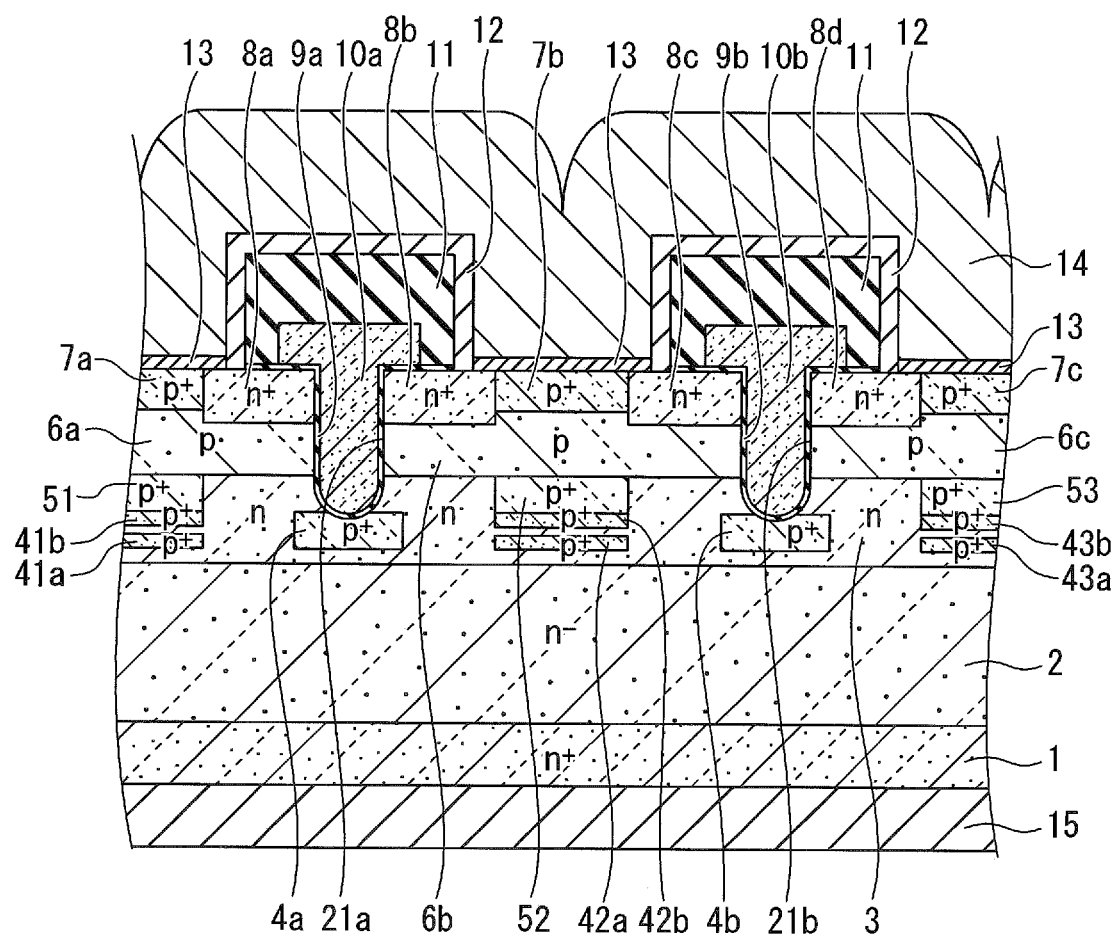
FIG. 30 is a cross-sectional view illustrating still another example of the insulated-gate semiconductor device according to another embodiment of the present invention.

In the embodiment of the present invention, as illustrated in FIG. 1, the structure in which the lower-buried regions 41a, 42a, and 43a and the gate-bottom protection-regions 4a and 4b are provided under the current spreading layer 3 is exemplified. However, as illustrated in FIG. 30, the bottom surfaces of the lower-buried regions 41a, 42a, and 43a and the gate-bottom protection-regions 4a and 4b may not be in contact with the drift layer 2 but may be located in an inner portion of the current spreading layer 3.

In the embodiment of the present invention, the MISFET having the insulated-gate electrode structure in the trench is exemplified, but the present invention is not limited to the MISFET. The invention can be applied to insulated-gate semiconductor devices having various insulated-gate electrode structures such as IGBTs having insulated-gate electrode structures in the trenches. As the trench gate type IGBT, there may employed a structure in which the $n^+$-type source regions 8a to 8d of the MISFET illustrated in FIG. 1 are used as emitter regions, and a $p^+$-type collector region is provided on the bottom surface side of the drift layer 2 instead of the $n^+$-type drain region 1.

In addition, in the embodiment of the present invention, the insulated-gate semiconductor device using SiC is exemplified. However, in addition to SiC, the present invention may also be applied to an insulated-gate semiconductor device using wide band gap semiconductor material, which has a band gap wider than silicon such as gallium nitride (GaN), diamond, or aluminum nitride (AlN) having a diffusion coefficient smaller than Si.

What is claimed is:

1. An insulated-gate semiconductor device, comprising:
    a drift layer having a first conductivity type, made of a semiconductor material having a band gap wider than that of silicon;
    a current spreading layer having the first conductivity type, provided on the drift layer and having an impurity concentration higher than that of the drift layer;
    a base region having a second conductivity type, provided on the current spreading layer;
    a main electrode region having the first conductivity type, provided in an upper portion of the base region and having an impurity concentration higher than that of the drift layer;
    an insulated gate-electrode structure provided in a trench penetrating the main electrode region and the base region;
    a gate-bottom protection-region having the second conductivity type, selectively provided in an inner portion of the current spreading layer so as to be in contact with a bottom of the trench and having an impurity concentration higher than that of the base region;
    a base-bottom buried-region having the second conductivity type, buried in an inner portion of the current spreading layer, being separated from the trench, having a bottom surface at the same depth as a bottom surface of the gate-bottom protection-region, and having an impurity concentration higher than that of the base region; and
    a separation layer having the first conductive type, configured to divide the base-bottom buried-region into a plurality of portions in a depth direction.

2. The insulated-gate semiconductor device of claim 1, wherein the base-bottom buried-region includes:

a plurality of lower-buried regions belonging to the same depth level as the gate-bottom protection-region and separated in the depth direction with the separation layer interposed; and an upper-buried region provided on the uppermost lower-buried region among the plurality of lower-buried regions.

3. The insulated-gate semiconductor device of claim 2, wherein the plurality of lower-buried regions and the gate-bottom protection-region have the same impurity concentration.

4. The insulated-gate semiconductor device of claim 2, wherein at least the lowermost lower-buried region among the plurality of lower-buried regions is floating.

5. The insulated-gate semiconductor device of claim 1, wherein a width of the gate-bottom protection-region is smaller than that of the base-bottom buried-region.

6. A method of manufacturing an insulated-gate semiconductor device, comprising:

forming a current spreading layer of a first conductivity type on a drift layer of the first conductivity type, the current spreading layer having an impurity concentration higher than that of the drift layer, the drift layer is made of a semiconductor material having a band gap wider than that of silicon;

selectively burying a gate-bottom protection-region of a second conductivity type in an inner portion of the current spreading layer;

burying a base-bottom buried-region of the second conductivity type in another inner portion of the current spreading layer, the base-bottom buried-region has a bottom surface at the same depth as a bottom surface of the gate-bottom protection-region, and the base-bottom buried-region is divided into a plurality of portions in a depth direction through a separation layer of the first conductivity type;

forming a base region of the second conductivity type on the current spreading layer;

forming a main electrode region of the first conductivity type in an upper portion of the base region, the main electrode region having an impurity concentration higher than that of the drift layer;

forming a trench penetrating the base region and reaching the gate-bottom protection-region; and forming an insulated gate-electrode structure inside the trench.

7. The method of manufacturing an insulated-gate semiconductor device of claim 6, wherein in the burying of the base-bottom buried-region, impurity ions are implanted with multiple projection range so as to achieve different peaks in Gaussian distributions, wherein the base-bottom buried-region is divided into a plurality of portions in the depth direction, as a profile of projection range of ion implantation becomes a Gaussian distribution.

* * * * *